United States Patent
Nakayama

(10) Patent No.: US 10,796,994 B2
(45) Date of Patent: Oct. 6, 2020

(54) SEMICONDUCTOR DEVICE AND IO-CELL

(71) Applicant: Renesas Electronics Corporation, Koutou-ku, Tokyo (JP)

(72) Inventor: Keisuke Nakayama, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 77 days.

(21) Appl. No.: 16/032,217

(22) Filed: Jul. 11, 2018

(65) Prior Publication Data

US 2018/0323148 A1    Nov. 8, 2018

Related U.S. Application Data

(62) Division of application No. 14/602,977, filed on Jan. 22, 2015, now Pat. No. 10,121,747.

(30) Foreign Application Priority Data

Jan. 24, 2014  (JP) ................................. 2014-011373

(51) Int. Cl.
*H01L 23/528* (2006.01)
*H01L 23/522* (2006.01)

(52) U.S. Cl.
CPC ...... *H01L 23/5286* (2013.01); *H01L 23/5226* (2013.01); *H01L 2224/05554* (2013.01); *H01L 2224/06* (2013.01); *H01L 2924/0002* (2013.01)

(58) Field of Classification Search
None
See application file for complete search history.

(56) References Cited

U.S. PATENT DOCUMENTS

| 2005/0167702 A1 | 8/2005 | Booth et al. |
| 2006/0071241 A1* | 4/2006 | Jin ...................... H01L 23/5223 257/203 |

(Continued)

FOREIGN PATENT DOCUMENTS

| JP | H 04-116850 A | 4/1992 |
| JP | H 1992-04196265 A | 7/1992 |

(Continued)

OTHER PUBLICATIONS

Official action dated Mar. 26, 2019, issued in Chinese patent application (No. 2015100374324).

(Continued)

*Primary Examiner* — Nishath Yasmeen
(74) *Attorney, Agent, or Firm* — Womble Bond Dickinson (US) LLP

(57) ABSTRACT

According to an aspect, a semiconductor device and an IO-cell include a plurality of first power supply lines and a plurality of second power supply lines alternately arranged in a first direction, the first and second power supply lines each being supplied with electric power in which the voltage of the electric power supplied to the first power supply is different from that supplied to the second power supply, and a third power supply line formed in a wiring layer different from a wiring layer in which the first and second power supply lines are arranged, the third power supply line being connected to adjacent first power supply lines among the plurality of first power supply lines through a via, in which all of the first, second and third power supply lines are formed so as to extend in a second direction perpendicular to the first direction.

9 Claims, 24 Drawing Sheets

(56) References Cited

U.S. PATENT DOCUMENTS

| | | |
|---|---|---|
| 2006/0175637 A1 | 8/2006 | Lee |
| 2009/0193271 A1* | 7/2009 | Chuang ............... H01L 27/0207 |
| | | 713/300 |
| 2010/0237508 A1 | 9/2010 | Utsumi |
| 2012/0247812 A1 | 10/2012 | Yasumori et al. |

FOREIGN PATENT DOCUMENTS

| | | |
|---|---|---|
| JP | 2006-012159 A | 1/2006 |
| JP | 4275110 | 3/2009 |
| JP | 2010-219332 | 9/2010 |

OTHER PUBLICATIONS

Official Action dated Sep. 5, 2017, issued in Japanese counterpart application (No. 2014-011373).
Official Action dated May 3, 2018, issued in Chinese counterpart application (No. 2018042701942040).

* cited by examiner

|  | PERMISSIBLE EM VALUE OF FIRST VIA LAYER (VIA 40) ||
| --- | --- | --- |
|  | NUMBER OF VIAS IN LAYER | PERMISSIBLE EM VALUE [mA] |
| COMPARATIVE EXAMPLE | 4096 | 409.6 |
| IO-CELL OF FIRST EXEMPLARY EMBODIMENT | 512 | 51.2 |

| | WIRING RESISTANCE VALUE IN X-DIRECTION (CROSSWISE DIRECTION) | | | |
|---|---|---|---|---|
| | NUMBER OF LINES IN FIRST GLOBAL WIRING LAYER [LINES] | NUMBER OF LINES IN SECOND GLOBAL WIRING LAYER [LINES] | NUMBER OF LINES IN THIRD GLOBAL WIRING LAYER [LINES] | COMBINED RESISTANCE OF GLOBAL WIRING LAYERS [Ω] |
| COMPARATIVE EXAMPLE | 0 | 16 | 16 | 0.469 |
| 10-CELL OF FIRST EXEMPLARY EMBODIMENT | 8 | 16 | 16 | 0.379 |

Fig. 12

| | WIRING RESISTANCE VALUE IN Y-DIRECTION (LENGTHWISE DIRECTION) | | | |
|---|---|---|---|---|
| | NUMBER OF LINES IN FIRST GLOBAL WIRING LAYER [LINES] | NUMBER OF VIAS IN FIRST VIA LAYER [VIAS] | NUMBER OF VIAS IN SECOND VIA LAYER [VIAS] | COMBINED RESISTANCE OF GLOBAL WIRING LAYERS [Ω] |
| COMPARATIVE EXAMPLE | 16 | — | — | 0.938 |
| IO-CELL OF FIRST EXEMPLARY EMBODIMENT | 16 | 2 | 250 | 6.622 |

| NUMBER OF IO-CELLS CONNECTED TO SURROUNDING LINE | WIRING RESISTANCE IN X-DIRECTION [Ω] | WIRING RESISTANCE IN Y-DIRECTION [Ω] | SUM OF WIRING RESISTANCES IN X- AND Y-DIRECTION [Ω] |
|---|---|---|---|
| 1 | 0.469 | 0.938 | 1.407 |
| 2 | 0.938 | 0.469 | 1.407 |
| 3 | 1.407 | 0.313 | 1.720 |
| 4 | 1.876 | 0.235 | 2.111 |
| 5 | 2.345 | 0.188 | 2.533 |
| 6 | 2.814 | 0.156 | 2.970 |
| 7 | 3.283 | 0.134 | 3.417 |
| 8 | 3.752 | 0.117 | 3.869 |
| 9 | 4.221 | 0.104 | 4.325 |
| 10 | 4.690 | 0.094 | 4.784 |
| 11 | 5.159 | 0.085 | 5.244 |
| 12 | 5.628 | 0.078 | 5.706 |
| 13 | 6.097 | 0.072 | 6.169 |
| 14 | 6.566 | 0.067 | 6.633 |
| 15 | 7.035 | 0.063 | 7.098 |
| 16 | 7.504 | 0.059 | 7.563 |
| 17 | 7.973 | 0.055 | 8.028 |
| 18 | 8.442 | 0.052 | 8.494 |
| 19 | 8.911 | 0.049 | 8.960 |
| 20 | 9.380 | 0.047 | 9.427 |

Fig. 15

| NUMBER OF IO-CELLS CONNECTED TO SURROUNDING LINE | WIRING RESISTANCE IN X-DIRECTION [Ω] | WIRING RESISTANCE IN Y-DIRECTION [Ω] | SUM OF WIRING RESISTANCES IN X- AND Y-DIRECTION [Ω] |
|---|---|---|---|
| 1 | 0.375 | 6.622 | 6.997 |
| 2 | 0.750 | 3.311 | 4.061 |
| 3 | 1.125 | 2.207 | 3.332 |
| 4 | 1.500 | 1.656 | 3.156 |
| 5 | 1.875 | 1.324 | 3.199 |
| 6 | 2.250 | 1.104 | 3.354 |
| 7 | 2.625 | 0.946 | 3.571 |
| 8 | 3.000 | 0.828 | 3.828 |
| 9 | 3.375 | 0.736 | 4.111 |
| 10 | 3.750 | 0.662 | 4.412 |
| 11 | 4.125 | 0.602 | 4.727 |
| 12 | 4.500 | 0.552 | 5.052 |
| 13 | 4.875 | 0.509 | 5.384 |
| 14 | 5.250 | 0.473 | 5.723 |
| 15 | 5.625 | 0.441 | 6.066 |
| 16 | 6.000 | 0.414 | 6.414 |
| 17 | 6.375 | 0.390 | 6.765 |
| 18 | 6.750 | 0.368 | 7.118 |
| 19 | 7.125 | 0.349 | 7.474 |
| 20 | 7.500 | 0.331 | 7.831 |

# SEMICONDUCTOR DEVICE AND IO-CELL

CROSS-REFERENCE TO RELATED APPLICATIONS

This is a Divisional of U.S. Ser. No. 14/602,977, filed Jan. 22, 2015, now U.S. Pat. No. 10,121,747, and claims the benefit of priority from Japanese patent application No. 2014-011373, filed on Jan. 24, 2014. The contents of the aforementioned applications are incorporated by references in their entirety.

BACKGROUND

The present invention relates to a semiconductor device and an IO-cell. In particular, the present invention relates to a semiconductor device including IO-cells arranged along the periphery of a semiconductor chip, and its IO-cells.

A semiconductor integrated circuit (also referred to as "LSI: Large Scale Integration") needs to be equipped with power supply lines in order to supply electric power to transistors formed on a semiconductor substrate. Large electric currents flow though these power supply lines. Therefore, it is necessary to avoid problems that would otherwise occur in the lines due to these large currents such as a voltage drop (IRDrop) and electro-migration in order to improve the performance and/or the reliability of the LSI. Therefore, Japanese Patent No. 4275110 and Japanese Unexamined Patent Application Publications No. H04-116850 and No. 2010-219332 disclose examples of methods of wiring power supply lines.

In particular, Japanese Patent No. 4275110 discloses an example in which two power supply lines are formed in a comb-like pattern, and the two power supply lines are arranged so that their comb-like sections engage with each other and a semiconductor chip is covered with these two power supply lines. Japanese Unexamined Patent Application Publications No. H04-116850 discloses an example in which power supply lines are arranged in a ring shape along the periphery of a chip. Japanese Unexamined Patent Application Publications No. 2010-219332 discloses an example of a semiconductor device including surrounding power supply lines in which power supply lines supplied with a power supply voltage and ground lines supplied with a ground voltage are alternately arranged, and in which surrounding power supply lines having the same potential are connected to each other through lines perpendicular to the extending direction of the surrounding lines.

SUMMARY

As semiconductor integrated circuits (also referred to as "LSIs: Large Scale Integrations") have become more sophisticated and their structures have become more microscopic in recent years, the scale of circuits mounted in the LSIs has been increasing. When the circuit scale increases as mentioned above, the amount (or the number) of power supply lines increases in order to supply sufficient electric power to the circuits which have increased in scale. Further, when circuit scale increases, the amount (or the number) of signal lines connected between circuits also increases. Therefore, in recent LSIs, there has been a problem that it is impossible to arrange the increased signal lines and/or increased power supply lines. Accordingly, there has been an attempt made to reduce the amount (or number) of the power supply lines by reducing the power consumption of the circuits by using a circuit technology such as DVFS (Dynamic Voltage Frequency Scaling).

However, in recent years, there has been a trend in which the number of wiring layers has been reduced for the purpose of reducing the chip cost or improving the reliability of LSIs. Therefore, even if the power consumption is reduced, the resistance value of the power supply lines cannot be sufficiently reduced. As a result, it has been very difficult to arrange the power supply lines and the signal lines while avoiding the problem of the IRDrop and the like.

Other problems to be solved and the novel features of the invention will be more apparent from the following descriptions in this specification and the attached drawings.

A first aspect of the present invention is a semiconductor device and an IO-cell including: a plurality of first power supply lines and a plurality of second power supply lines alternately arranged in a first direction, the first and second power supply lines each being supplied with electric power in which the voltage of the electric power supplied to the first power supply is different from that supplied to the second power supply; and a third power supply line formed in a wiring layer different from a wiring layer in which the first and second power supply lines are arranged, the third power supply line being connected to adjacent first power supply lines among the plurality of first power supply lines through a via, in which all of the first, second and third power supply lines are formed so as to extend in a second direction perpendicular to the first direction.

According to the above-described embodiment, it is possible to reduce the resistance value of power supply lines formed by the first to third power supply lines.

BRIEF DESCRIPTION OF THE DRAWINGS

The above and other aspects, advantages and features will be more apparent from the following description of certain embodiments taken in conjunction with the accompanying drawings, in which:

FIG. 12 is a table showing a relation between the number of lines in a crosswise direction in a global wiring layer and a wiring resistance in an IO-cell according to the first embodiment, and a relation in an IO-cell of a semiconductor device according to a comparative example;

FIG. 13 is a table showing a relation between the number of lines in a lengthwise direction in a global wiring layer and a wiring resistance in an IO-cell according to the first embodiment, and a relation in an IO-cell of a semiconductor device according to a comparative example;

FIG. 14 is a table showing a relation between the number of IO-cells connected to a surrounding line and the resistance value of a power supply line in a semiconductor device according to a comparative example;

FIG. 15 is a table showing a relation between the number of IO-cells connected to a surrounding line and the resistance value of a power supply line in a semiconductor device according to the first embodiment;

DETAILED DESCRIPTION

For clarifying the explanation, the following descriptions and the drawings may be partially omitted or simplified as appropriate. Further, the same symbols are assigned to the same components throughout the drawings, and their duplicated explanation is omitted as necessary.

Figure 1:
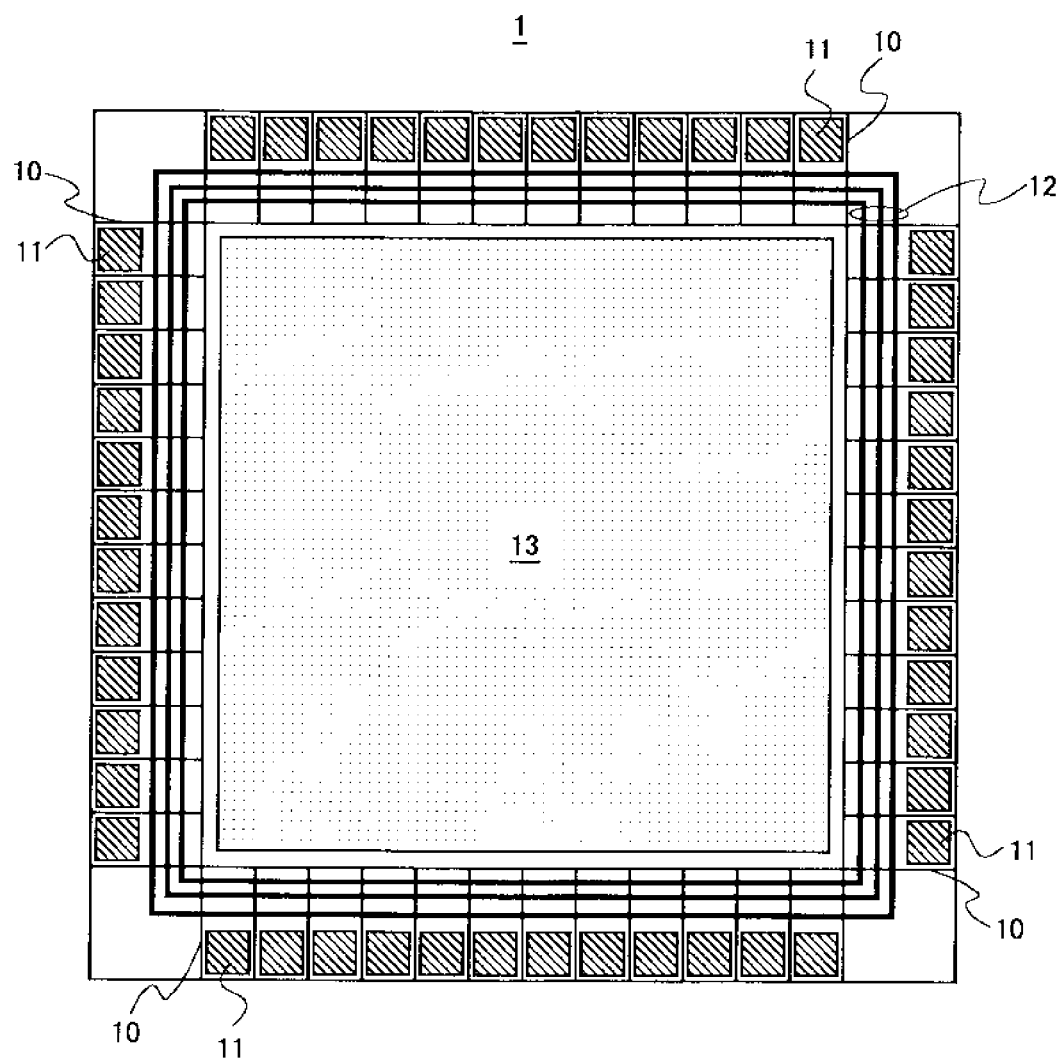
FIG. 1 is a schematic diagram showing a layout of a semiconductor device according to a first embodiment.

Firstly, FIG. 1 shows a schematic diagram of a layout of a semiconductor device 1 according to a first embodiment. FIG. 1 shows the layout of the entire semiconductor chip of the semiconductor device 1 according to the first embodiment. As shown in FIG. 1, IO-cells 10 are provided so that they are arranged along the periphery of the semiconductor chip in the semiconductor device 1 according to the first embodiment. Note that the IO-cells 10 do not necessarily have to be arranged along the entire periphery of the semiconductor chip. Further, they are disposed apart from one another according to the positions of the pads.

Further, pads 11 are provided in the IO-cells 10. Surrounding lines 12 are disposed in the parts of the IO-cells 10 in which the pads 11 are not disposed. Further, the semiconductor device 1 includes an internal logic formation area 13 in the area surrounded by the IO-cells 10.

The surrounding lines 12 include, for example, a power supply line(s) and a ground line(s). FIG. 1 shows an example in which the surrounding lines 12 are disposed so that they go around the entire periphery of the semiconductor chip. However, the surrounding lines 12 do not necessarily have to be formed so as to entirely surround the semiconductor chip. The only requirement is that the surrounding lines 12 should extend in a direction in which the surrounding lines 12 surround the semiconductor chip. For example, the surrounding lines 12 may be separated halfway through the surrounding path. A power supply voltage or a ground voltage is supplied to each of the surrounding lines 12 from a pad(s) (not shown) or a power supply circuit.

Figure 2:
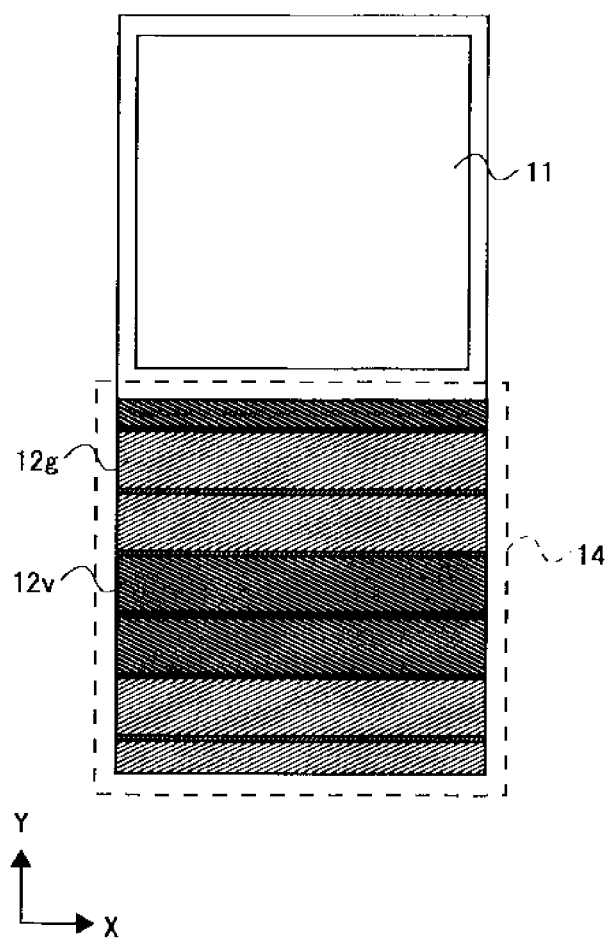
FIG. 2 is a schematic diagram showing a layout of an IO-cell according to the first embodiment.

Next, details of an IO-cell according to the first embodiment are explained hereinafter. FIG. 2 shows a schematic diagram of a layout of an IO-cell 10 according to the first embodiment. As shown in FIG. 2, the IO-cell 10 includes a pad 11 and an IO-logic formation area 14. In the IO-cell 10 according to the first embodiment, the pad 11 and the IO-logic formation area 14 are disposed so that they do not overlap each other. Further, a circuit(s) such as a buffer circuit is formed in the IO-logic formation area 14. In the example shown in FIG. 12, transistors that form the circuit (s) are concealed by a wiring layer formed above the layer of the transistors. Further, as shown in FIG. 2, surrounding power supply lines 12v and surrounding ground lines 12g are formed in the IO-logic formation area 14. The surrounding power supply lines 12v and the surrounding ground lines 12g are parts of the details of the surrounding lines 12 shown in FIG. 1. Further, only the lines that are formed in the uppermost wiring layer are shown in FIG. 2.

One of the features of the semiconductor device 1 according to the first embodiment is its method for wiring (or routing) the surrounding power supply lines 12v and the surrounding ground lines 12g in the IO-cell 10. The surrounding power supply lines 12v and the surrounding ground lines 12g are formed so that they are aligned and connected with the surrounding power supply lines 12v and the surrounding ground lines 12g of adjacent IO-cells 10. In the following explanation, the surrounding power supply lines 12v and the surrounding ground lines 12g are referred to as "global lines" and thereby differentiated from local lines that connect circuit elements such as transistors inside the IO-logic formation areas 14. The wiring structure of the global lines of the IO-cell 10 is explained hereinafter in a more detailed manner.

Note that the following explanation is given on the assumption that: a first direction (e.g., Y-direction) is defined as a direction perpendicular to a peripheral side of a semiconductor chip; a second direction (e.g., X-direction) is defined as a direction parallel to the peripheral side of the semiconductor chip; and a third direction (e.g., Z-direction) is defined as the thickness direction of the semiconductor chip. Further, it is assumed that the first and second directions are perpendicular to each other.

Figure 3:
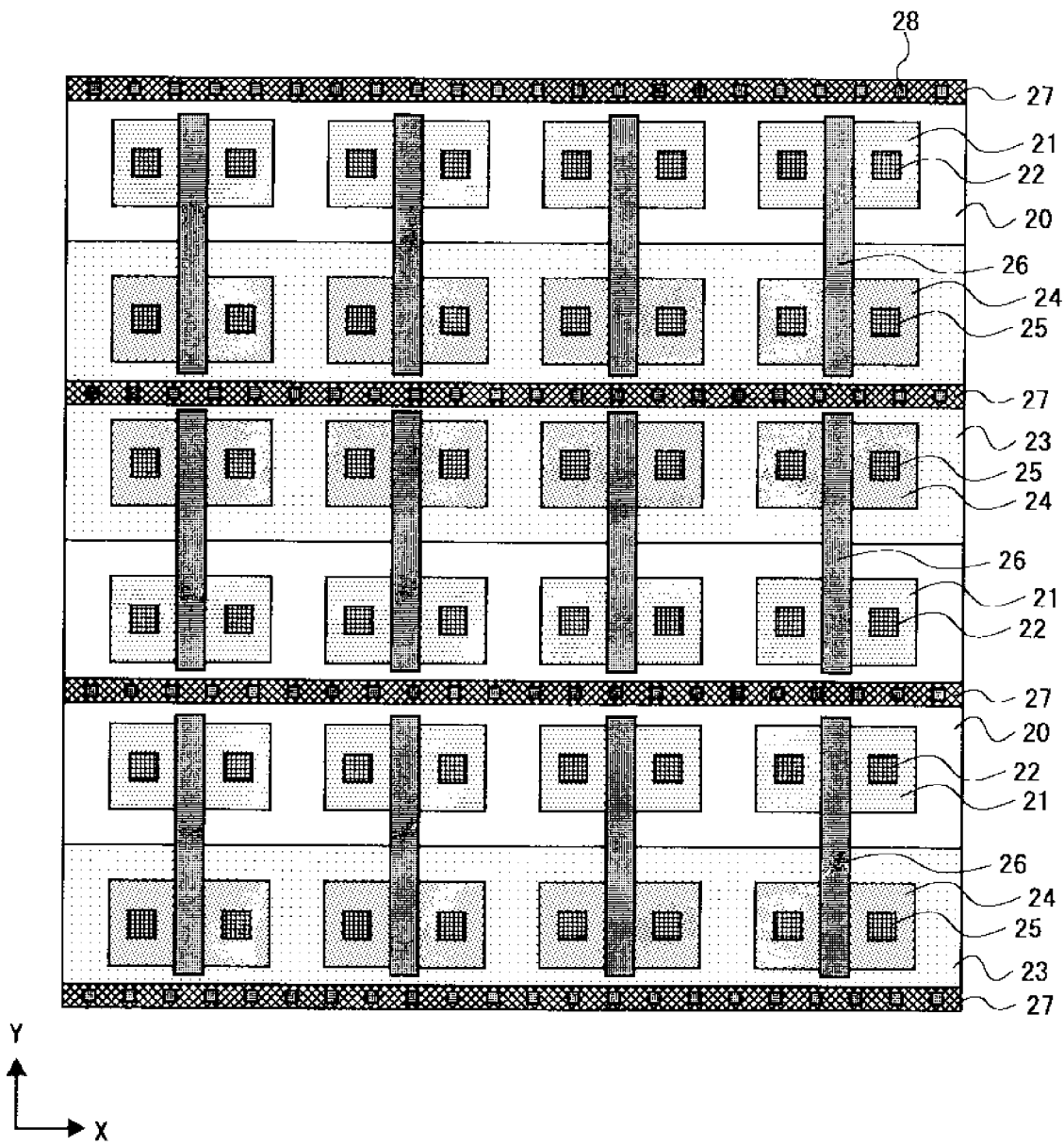
FIG. 3 is a schematic diagram showing a layout of transistors in an IO-logic formation area of an IO-cell according to the first embodiment.

FIG. 3 shows a schematic diagram of a layout of transistors in the IO-logic formation area 14 of the IO-cell according to the first embodiment. In the example shown in FIG. 3, a part of the IO-logic formation area 14 is shown. In the IO-logic formation area 14, transistors are arranged in the layout structure shown in FIG. 3. As shown in FIG. 3, N-type well regions 20 and P-type well regions 23 are alternately arranged in the Y-direction in the IO-cell 10 according to the first embodiment. Further, P-type diffusion regions 21 are formed in the N-type well regions 20, and N-type diffusion regions 24 are formed in the P-type well regions 23. The P-type diffusion regions 21 and the N-type diffusion regions 24 are provided to form the sources or drains of the transistors. Further, gate electrodes 26 are formed in such a manner that each gate electrode extends across two diffusion regions arranged side by side in the vertical direction in the figure and divides its diffusion region into two sections. That is, PMOS transistors are formed in the N-type well regions 20 and NMOS transistors are formed in the P-type well regions 23. Further, well contact lines 27 and well contacts 28 are formed above the N-type well regions 20 and the P-type well regions 23. Electric power is supplied to the wells through the well contact lines 27 and the well contacts 28.

Further, in the case of the example shown in FIG. 3, there are four lengthwise rows of transistors, in each of which the transistors are arranged in the Y-direction, and three crosswise rows of inverters, in each of which the inverters formed by NMOS and PMOS transistors are arranged in the X-direction in the IO-cell 10 according to the first embodiment. The number of the transistor rows and the number of the inverter rows can be determined as desired according to the required ability of the IO-cell 10. Further, FIG. 3 shows a layout in which PMOS and NMOS transistors are arranged in rows along the boundaries between the N-type well regions 20 and P-type well regions 23. By employing this layout, the area where the gate electrodes 26 are disposed can be reduced when the inverters are formed by transistors. Note that the inverter is one of the components of the buffer circuit.

Further, as shown in FIG. 3, contacts 22 are disposed above the P-type diffusion regions 21 and contacts 25 are disposed above the N-type diffusion regions 24. Each diffusion region is connected to a local line(s) or the like formed in an upper layer through the contacts. Note that instead of or in addition to the contacts, a wiring structure including vias can also be used for the connection between each diffusion region and a local line(s).

The IO-cell 10 according to the first embodiment includes a first local wiring layer, a second local wiring layer, a first global wiring layer, a second global wiring layer, and a third global wiring layer as listed in the Z-direction starting from the wiring layer closest to the semiconductor substrate on which the transistors are formed. That is, lines are formed by using five wiring layers in the IO-cell 10 according to the first embodiment. Note that the first and second local wiring layers are used to connect the transistors disposed inside the IO-cell 10, and therefore their explanations are omitted in this specification. In contrast to this, the wiring structure in the global wiring layers including the first, second and third global wiring layers is one of the features of the semiconductor device 1 according to the first embodiment. Therefore, these global wiring layers are explained hereinafter in a more detailed manner.

The semiconductor device 1 according to the first embodiment includes, for the global wiring layers in the IO-cell 10, a first wiring layer in which a plurality of first power supply lines supplied with first electric power and a plurality of second power supply lines supplied with second electric power are alternately arranged in a first direction (e.g., Y-direction), and a second wiring layer in which a third power supply line connected to adjacent first power supply lines among the plurality of first power supply lines through a via is disposed, the third power supply line being supplied with the first electric power. Further, in the semiconductor device 1 according to the first embodiment, all of the first, second and third power supply lines are formed so as to extend in a second direction (e.g., X-direction) perpendicular to the Y-direction. Further, in the semiconductor device 1 according to the first embodiment, a fourth power supply line connected to adjacent second power supply lines among the plurality of second power supply lines through a via is disposed in the second wiring layer, the fourth power supply line being supplied with the second electric power.

It should be noted that in the semiconductor device 1 according to the first embodiment, the first wiring layer is formed by the first global wiring layer while the second wiring layer is formed by the second and third global wiring layers. Further, it is assumed that a power supply voltage is supplied from a first power supply and a ground voltage is supplied from a second power supply.

The above-described global wiring layers are explained hereinafter in detail by showing a layout for each global wiring layer. Firstly, FIG. 4 shows a schematic diagram of a layout of the first global wiring layer of the IO-cell 10 according to the first embodiment.

Figure 4:
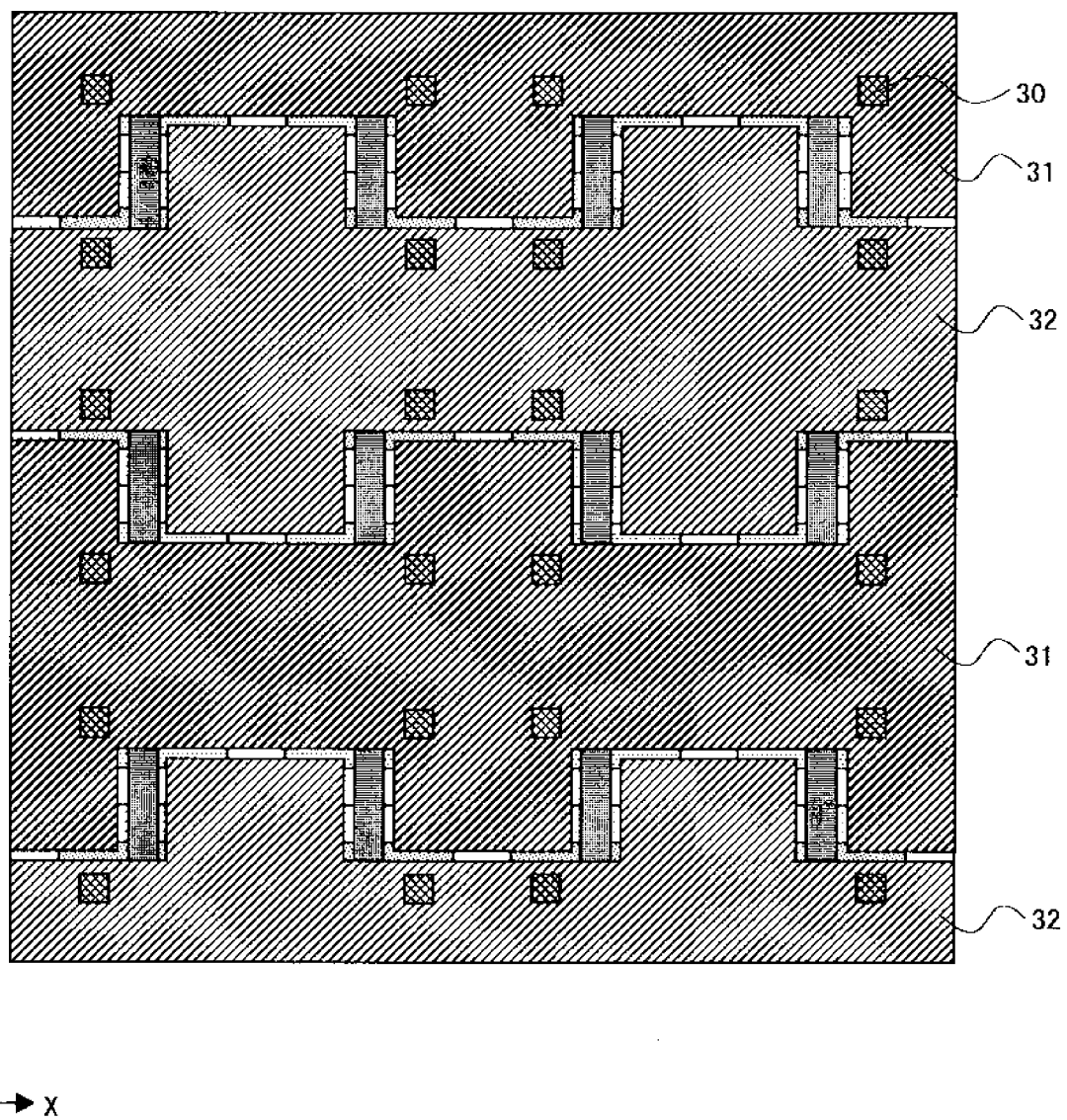
FIG. 4 is a schematic diagram showing a layout of a first global wiring layer of an IO-cell according to the first embodiment.

As shown in FIG. 4, first power supply lines (e.g., first layer power supply lines 31) and second power supply lines (e.g., first layer ground lines 32) are disposed in the first global wiring layer in the IO-cell 10 according to the first embodiment. A power supply voltage is supplied to the first layer power supply lines 31 and a ground voltage is supplied to the first layer ground lines 32. The first layer power supply lines 31 are connected to the sources of the PMOS transistors shown in FIG. 3 through vias 30. Further, the first layer ground lines 32 are connected to the sources of the NMOS transistors shown in FIG. 3 through the vias 30. Note that the first layer power supply lines 31 and the first layer ground lines 32 are electrically connected to their respective transistors through stack vias including the vias 30 or a wiring structure including a local wiring layer(s) and other vias.

The first layer power supply lines 31 and the first layer ground lines 32 are formed so as to extend in a direction parallel to the X-direction. The first layer power supply lines 31 are generally disposed so as to cover a layer above the N-type well region 20, and the first layer ground lines 32 are generally disposed so as to cover a layer above the P-type well region 23. Further, when the sides of the first layer power supply lines 31 and the first layer ground lines 32 parallel to the X-direction are defined as the crosswise sides, each of the first layer power supply lines 31 and the first layer ground lines 32 has a concavo-convex shape along at least one of its crosswise sides. Further, as shown in FIG. 4, the first layer power supply lines 31 and the first layer ground lines 32 are formed so that the convex parts of the first layer power supply lines 31 engage with the concave parts of the first layer ground lines 32. That is, the first layer power supply lines 31 and the first layer ground lines 32 are arranged so that their concavo-convex parts engage with each other.

Further, as shown in FIG. 4, the tips of the convex parts of the first layer power supply lines 31 are formed above the P-type well regions 23 adjacent to the N-type well regions 20 formed below the first layer power supply lines 31.

Further, the tips of the convex parts of the first layer ground lines 32 are formed above the N-type well regions 20 adjacent to the P-type well regions 23 formed below the first layer ground lines 32. That is, the tips of the convex parts of the first layer power supply lines 31 and the first layer ground lines 32 are formed in positions that are located beyond imaginary extension lines that are projected in the Z-direction from the boundaries between the N-type well regions 20 and the P-type well regions 23.

Further, to explain the configuration from a different point of view, the first layer power supply lines 31 and the first layer ground lines 32 have such shapes that these lines protrude from the crosswise sides in a comb-like shape. Further, the first layer power supply lines 31 and the first layer ground lines 32 are formed so that their comb-like shapes engage with each other.

Figure 5:
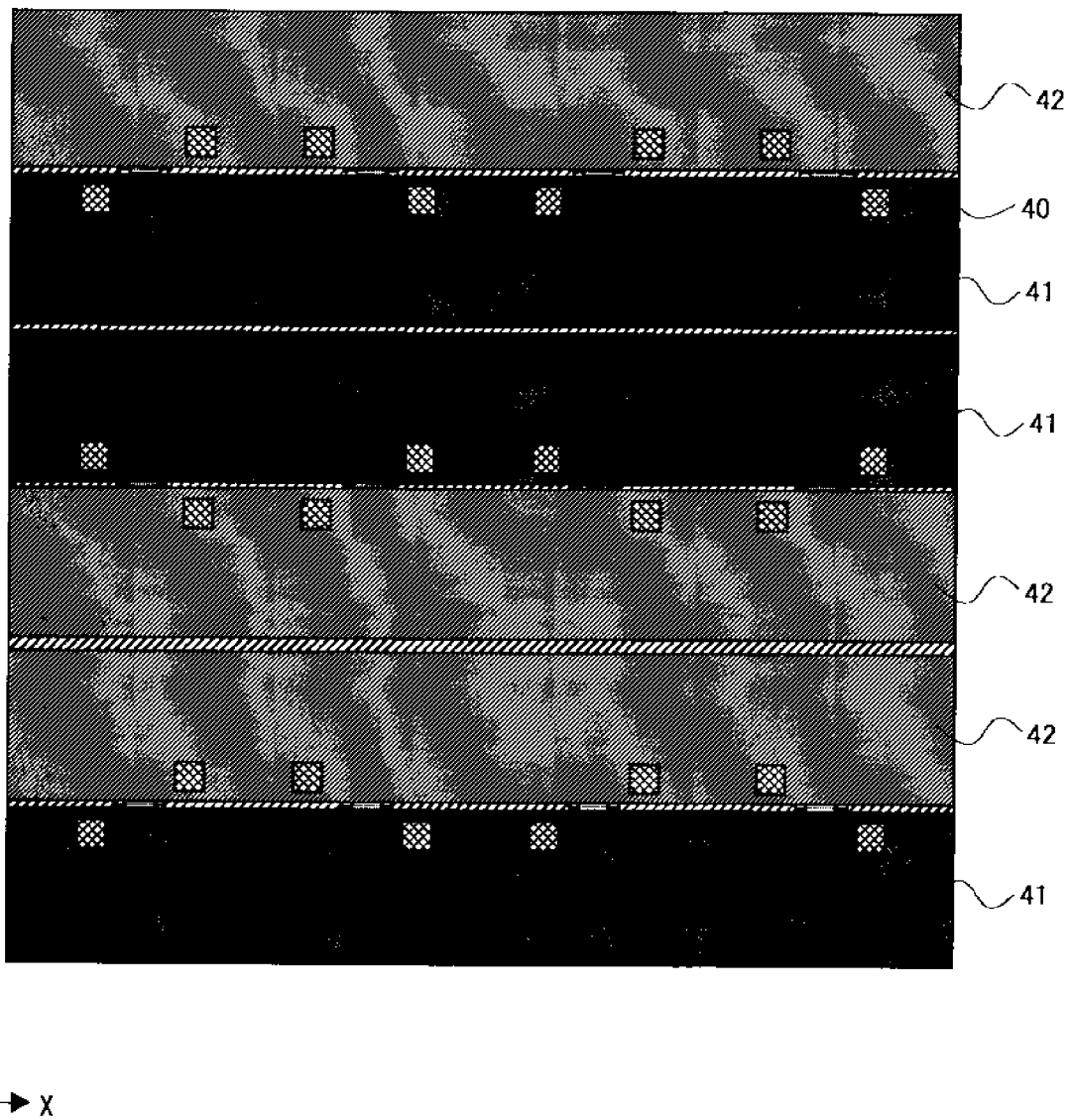
FIG. 5 is a schematic diagram showing a layout of a second global wiring layer of the IO-cell according to the first embodiment.

Next, FIG. 5 shows a schematic diagram of a layout of a second global wiring layer of the IO-cell 10 according to the first embodiment. As shown in FIG. 5, second layer power supply lines 41 and second layer ground lines 42 are disposed in the second global wiring layer. First electric power is supplied to the second layer power supply lines 41 and second electric power is supplied to the second layer ground lines 42. In the example shown in FIG. 5, each of the second layer power supply lines 41 and the second layer ground lines 42 are formed in such a manner that two lines form one line pair. In the semiconductor device 1 according to the first embodiment, two lines of the second layer power supply lines 41, which are disposed as one line pair in the second global wiring layer, are connected to each other by a line formed in the third global wiring layer. By this connection, these two lines of the second layer power supply lines 41 are used as one third power supply line. As for the second layer ground lines 42, two lines of the second layer ground lines 42, which are disposed as one line pair, are also connected to each other by a line formed in the third global wiring layer. Therefore, these two lines of the second layer ground lines 42 are used as one fourth power supply line. That is, in FIG. 5, a line pair formed by two lines can be regarded as one line. Further, as shown in FIG. 5, a plurality of line pairs, to which different voltages are supplied, are alternately arranged in the Y-direction in the second global wiring layer.

As shown in FIG. 5, each pair of the second layer power supply lines 41 is connected to two adjacent first layer power supply lines 31 disposed in the first global wiring layer through vias 40. Further, the second layer ground lines 42 are connected to adjacent first layer ground lines 32 disposed in the first global wiring layer through the vias 40. Note that in the semiconductor device 1 according to the first embodiment, the vias 40 that connect lines formed in the first global wiring layer with lines formed in the second global wiring layer are disposed near the tips of the convex parts of the first layer power supply lines 31 and the first layer ground lines 32.

Figure 6:
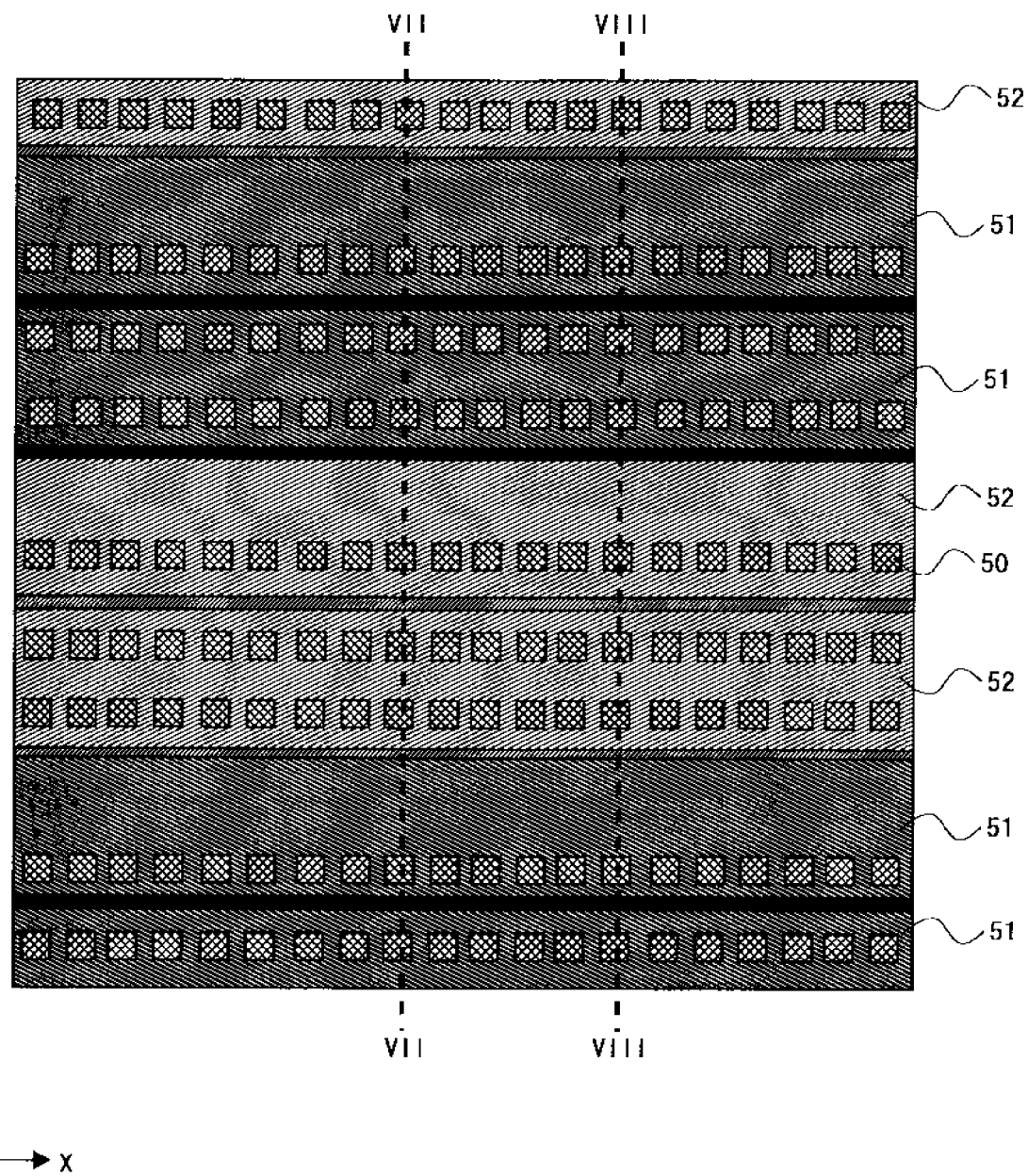
FIG. 6 is a schematic diagram showing a layout of a third global wiring layer of the IO-cell according to the first embodiment.

Next, FIG. 6 shows a schematic diagram of a layout of a third global wiring layer of the IO-cell 10 according to the first embodiment. As shown in FIG. 6, third layer power supply lines 51 and third layer ground lines 52 are disposed in the third global wiring layer. The first electric power is supplied to the third layer power supply lines 51 and the second electric power is supplied to the third layer ground lines 52. In the example shown in FIG. 6, each of the third layer power supply lines 51 and the third layer ground lines 52 are formed in such a manner that two lines form one line pair. Each of the two lines forming a line pair of the third layer power supply lines 51 is connected to the second layer power supply lines 41 through vias 50. That is, the same voltage is supplied to the second layer power supply lines 41 and the third layer power supply lines 51 and hence they function as one third power supply line. Each of the two lines forming a line pair of the third layer ground lines 52 is connected to the second layer ground lines 42 through the vias 50. That is, the same voltage is supplied to the second layer ground lines 42 and the third layer ground line 52 and hence they function as one fourth power supply line. That is, in FIG. 6, a line pair formed by two lines can be regarded as being one line. Further, as shown in FIG. 6, a plurality of line pairs, to which different voltages are supplied, are alternately arranged in the Y-direction in the third global wiring layer.

Note that it is desirable that as many as possible of the vias 50, which connect lines formed in the second global wiring layer with lines formed in the third global wiring layer, be disposed. This is because by disposing as many of the vias 50 as possible, the resistance value of the third and fourth power supply lines can be reduced.

Figure 7:
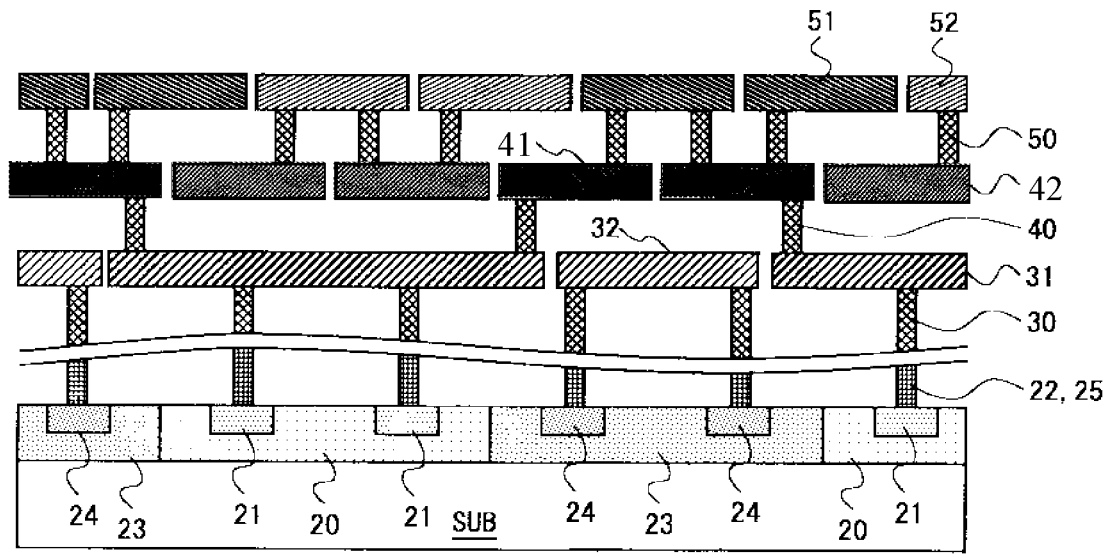
FIG. 7 is a cross section of the IO-cell taken along a line VII-VII of FIG. 6.
Figure 7:
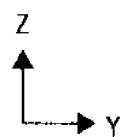

Next, a cross sectional structure of the global wiring layers and their peripheral elements of the semiconductor device 1 according to the first embodiment is explained. Note that in the following explanation of the cross sectional structure of the global wiring layers and their peripheral elements, explanations of lines formed in the local wiring layers such as the well contact lines 27 and the well contacts 28 are omitted. FIG. 7 shows a cross section of the IO-cell taken along a line VII-VII of FIG. 6. As shown in FIG. 7, the N-type well regions 20 and P-type well regions 23 are formed on a semiconductor substrate SUB in the semiconductor device 1 according to the first embodiment. Further, the P-type diffusion regions 21 are formed in the N-type well regions 20, and the N-type diffusion regions 24 are formed in the P-type well regions 23. Further, the N-type diffusion regions 24 are connected to the first layer ground lines 32 through a wiring structure including the contacts 25 and the vias 30. The P-type diffusion regions 21 are connected to the first layer power supply lines 31 through a wiring structure including the contacts 22 and the vias 30.

Further, as shown in FIG. 7, the line width (line width in the Y-direction) of the first layer power supply line 31 is wider than that of the first layer ground line 32 in the first global wiring layer in the cross section taken along the line VII-VII. Further, a line pair formed by the second layer power supply line 41 is formed above the first layer ground line 32 and a line pair formed by the second layer ground line 42 is formed above the first layer power supply line 31 in the second global wiring layer in the cross section taken along the line VII-VII. Further, the total line width of the line pair formed by the second layer power supply line 41 is roughly equal to that of the line pair formed by the second layer ground line 42.

Further, as shown in FIG. 7, the two lines forming the line pair in the second global wiring layer are connected to each other by a line that is formed in the third global wiring layer and supplied with the same voltage as that for the two lines. More specifically, the two lines of the second layer power supply line 41 are connected to each other by the third layer power supply line 51, and the two lines of the second layer ground line 42 are connected to each other by the third layer ground line 52.

Figure 8:
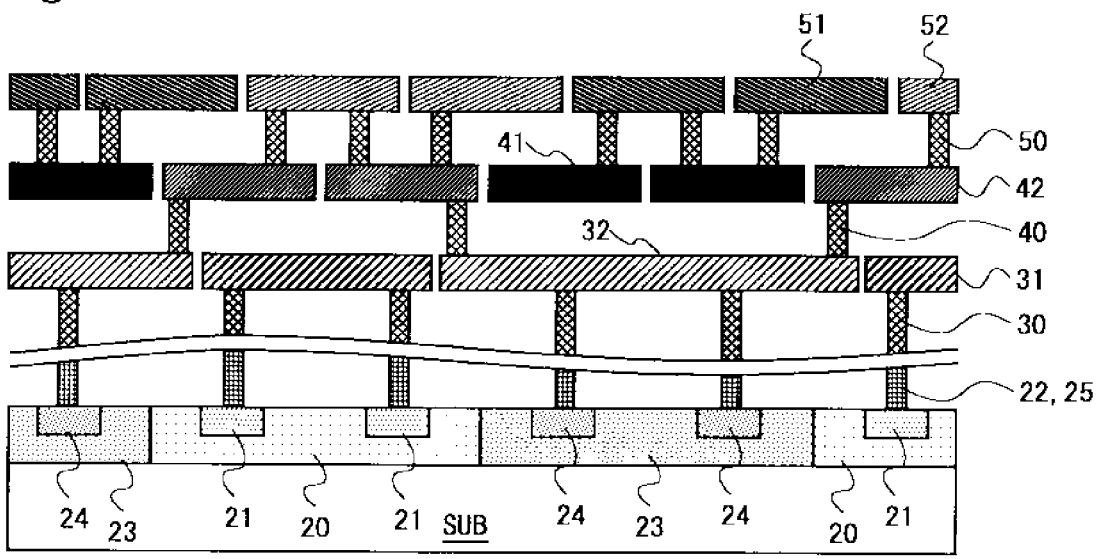
FIG. 8 is a cross section of the IO-cell taken along a line VIII-VIII of FIG. 6.
Figure 8:
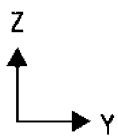

FIG. 8 shows a cross section of the IO-cell taken along a line VIII-VIII of FIG. 6. As shown in FIG. 8, since the structure of the transistors formed on the semiconductor substrate SUB in the cross section taken along the line VIII-VIII is the same as that in the cross section taken along the line VII-VII, their explanations are omitted here.

As shown in FIG. 8, the line width (line width in the Y-direction) of the first layer ground line 32 is wider than that of the first layer power supply line 31 in the first global wiring layer in the cross section taken along the line VIII-VIII. Further, a line pair formed by the second layer power supply line 41 is formed above the first layer ground line 32 and a line pair formed by the second layer ground line 42 is formed above the first layer power supply line 31 in the second global wiring layer in the cross section taken along the line VIII-VIII. Further, the total line width of the line pair formed by the second layer power supply line 41 is roughly equal to that of the line pair formed by the second layer ground line 42.

Further, as shown in FIG. 8, the two lines forming the line pair in the second global wiring layer are connected to each other by a line that is formed in the third global wiring layer and supplied with the same voltage as that for the two lines. More specifically, the two lines of the second layer power supply line 41 are connected to each other by the third layer power supply line 51, and the two lines of the second layer ground line 42 are connected to each other by the third layer ground line 52.

As shown in FIGS. 7 and 8, the global wiring layers have such a structure that lines to which electric powers having different voltages are supplied are stacked in the vertical direction (e.g., the Z-direction) of the semiconductor chip above the transistors in the semiconductor device 1 according to the first embodiment.

Figure 9:
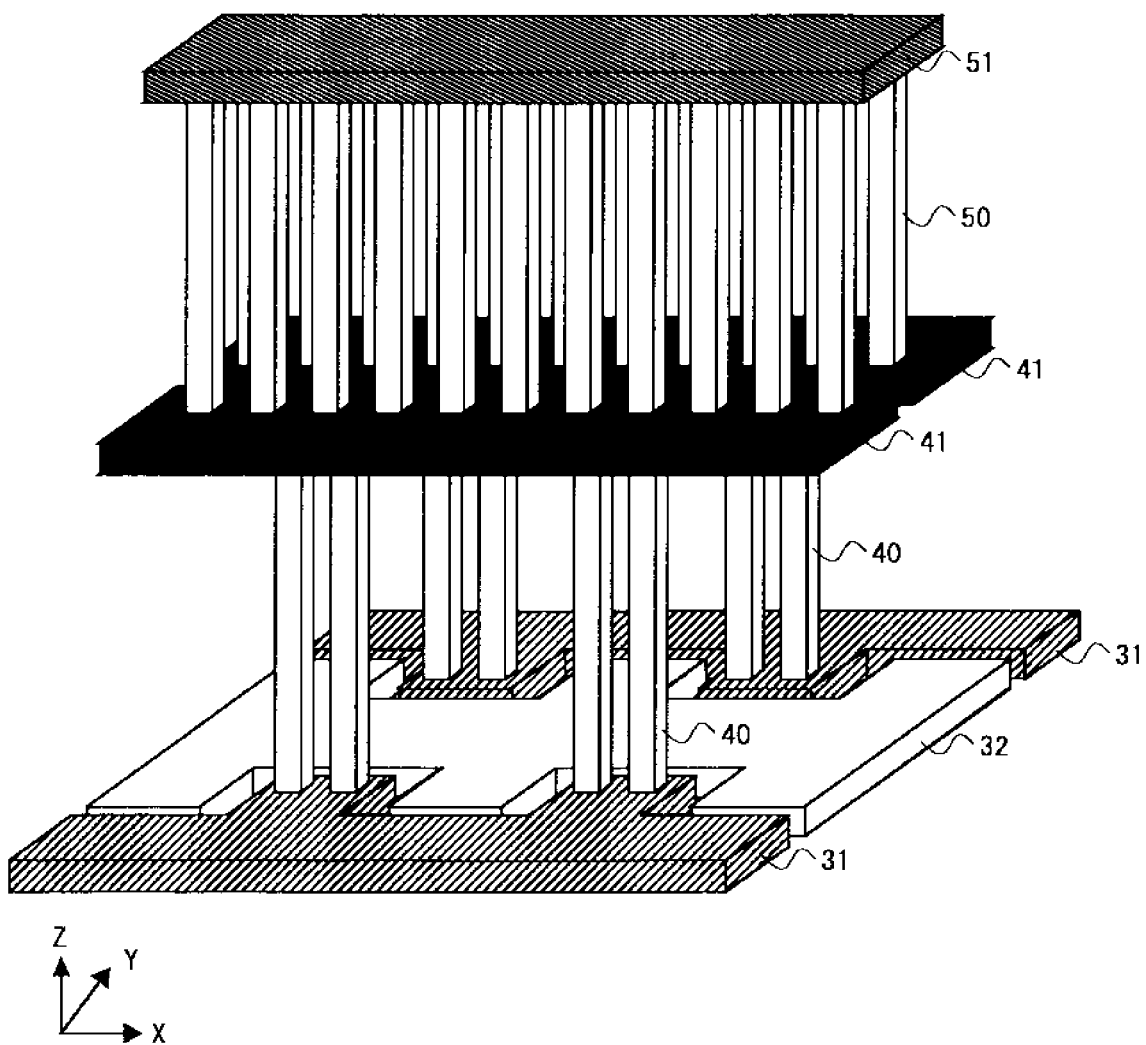
FIG. 9 is a perspective view showing a structure of power supply lines in first to third global wiring layers of an IO-cell according to the first embodiment.

To explain the above-described wiring structure in a more detailed manner, FIG. 9 shows a perspective view showing a structure of power supply lines in the first to third global wiring layers of the IO-cell according to the first embodiment. As shown in FIG. 9, all the lines formed in the first to third global wiring layers are formed so as to extend in the second direction in the semiconductor device according to the first embodiment. Further, the first layer power supply lines 31 that are adjacent to each other in the lengthwise direction (Y-direction) in the first global wiring layer and have the same potential are connected to each other by the second layer power supply lines 41 and the third layer power supply lines 51 formed in the second and third global wiring layers. Further, lines formed in different wiring layers are connected to each other through the vias 40 and/or vias 50.

As explained above, adjacent lines between which a line(s) supplied with a voltage different from that of the adjacent lines is disposed are connected to each other while all the power supply lines through which electric power is supplied to IO-cells 10 are formed so as to extend in the X-direction parallel to the peripheral side of the semiconductor chip in the semiconductor device 1 according to the first embodiment. As a result, it is possible to increase the number of parallel lines including a power supply line and a ground line that are disposed so as to surround the semiconductor chip, and thereby reduce the resistance value of these surrounding lines in the semiconductor device 1 according to the first embodiment.

Figures 10, 11:
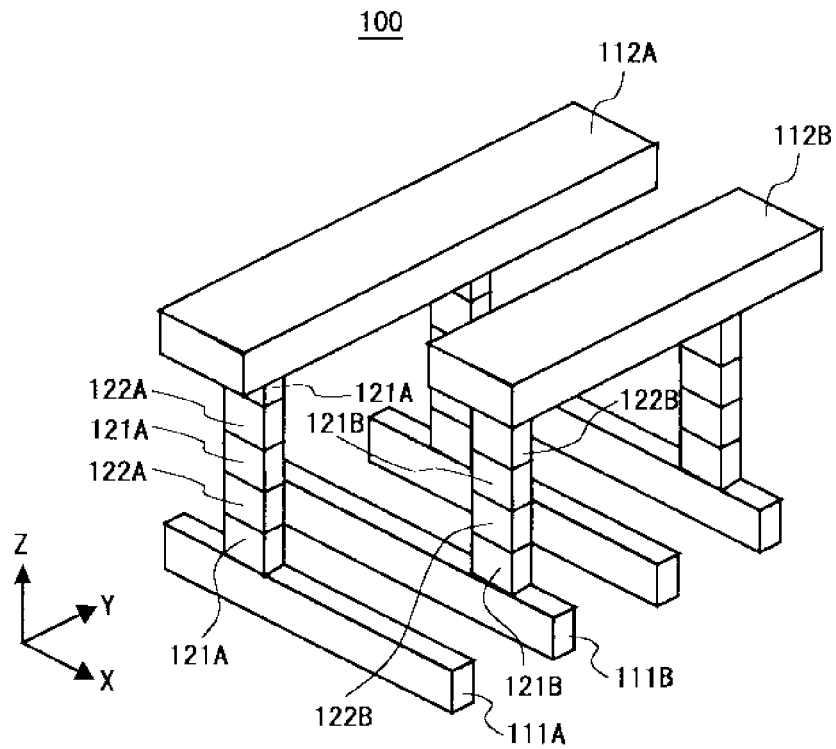
FIG. 10 is a perspective view showing a structure of power supply lines and ground lines of a semiconductor device according to a comparative example.
FIG. 11 is a table in which the number of vias and the permissible current of the vias of an IO-cell according to the first embodiment are compared with those of an IO-cell of a semiconductor device according to a comparative example.

The effect of reducing the resistance value of the surrounding lines is explained hereinafter in a more detailed manner. Therefore, FIG. 10 is a perspective view showing a structure of the power supply lines and the ground lines of a semiconductor device 100 according to a comparative example. As shown in FIG. 10, the semiconductor device 100 according to the comparative example includes first power supply lines 111A and second power supply lines 111B both extending in a direction in which these power supply lines surround the semiconductor chip (e.g., in the X-direction). These first and second power supply lines 111A and 111B are alternately arranged in the Y-direction perpendicular to the X-direction. Further, in the semiconductor device 100, the first power supply lines 111A formed in different positions are connected to each other by first power supply lines 112A. Further, in the semiconductor device 100, the second power supply lines 111B formed in different positions are connected to each other by second power supply lines 112B. Note that the first power supply lines 111A are connected to the first power supply lines 112A by a wiring structure formed by vias 121A and connection lines 122A. Further, the second power supply lines 111B are connected to the second power supply lines 112B by a wiring structure formed by vias 121B and connection lines 122B.

As described above, in the semiconductor device 100 according to the comparative example, the power supply lines that are disposed apart from one another in the same wiring layer are connected to each other by providing lines extending in a direction perpendicular to these power supply lines in a wiring layer different from that in which the power supply lines are disposed. Therefore, there is a problem in the semiconductor device 100 according to the comparative example that the number of parallel power supply lines is smaller than that of the semiconductor device 1 according to the first embodiment and hence the wiring resistance cannot be reduced.

Next, the wiring resistance of the semiconductor device 1 according to the first embodiment is numerically compared with the wiring resistance of the semiconductor device 100 according to the comparative example. Firstly, the conditions for calculating the resistance value of the power supply lines are defined as shown below. Note that in this examination, it is assumed that the first and second power supply lines 111A and 111B of the semiconductor device according to the comparative example are disposed so as to extend in the X-direction and the first and second power supply lines 112A and 112B thereof are disposed so as to extend in the Y-direction.

Width of IO-cell (Width in the X-direction): 50 [μm]
Height of IO-logic formation area 14 (Width in the Y-direction): 100 [μm]
Height allotted to power supply lines (Width in the Y-direction): 50 [μm]
Height allotted to ground lines (Width in the Y-direction): 50 [μm]
Size of IO-logic formation area 14: 2500 [μm²]
Operating current of IO-logic formation area 14: 50 [μA]
Line width of one line in the Y-direction in first global wiring layer: 1.0 [μm]
Line interval in the Y-direction in first global wiring layer: 2.0 [μm]
Line width of one line in the Y-direction in second and third global wiring layers: 1.0 [μm]
Line interval in the Y-direction in second and third global wiring layers: 0.5 [μm]
Line sheet resistance of global wiring layers: 0.5 [Ω/□]
Permissible current per via: 100 [μA]
Via size: 0.1 [μm/□]
Resistance value of via: 15 [Ω]
Line width in the X-direction in first global wiring layer: 1.0 [μm]
Line interval in the X-direction in first global wiring layer: 2.0 [μm]
Number of vias 40 in each convex part of line in first global wiring layer: 2 [vias]

Maximum number of vias 40 in each convex part of line in first global wiring layer: 2 [vias]
Length of one convex part of line in the Y-direction in first global wiring layer: 4.0 [μm]
Interval between vias 50 formed between second and third global wiring layers: 0.1 [μm]

Firstly, the permissible current of a surrounding power supply line under the aforementioned conditions is examined. In view of the above-described conditions, the current density per IO-cell can be derived from the below-shown Expression (1).

(Current density)=(Operating current of IO-logic formation area 14)/(Size of IO-logic formation area 14)

=50[μA]/2500[μm²]

=0.02[μA/μm²]     (1)

Next, the permissible size S per via is calculated based on the below-shown Expression (2).

(Permissible size S)=(Permissible current per via)/(Current density of IO-logic formation area 14)

=100[μA]/0.02[μA/μm²]

=5000[μm²]

In the IO-cell 10, among all the vias 40, the number of the vias 40 that connect the first and second global wiring layers is the smallest. Therefore, the number of the vias 40 in the IO-cell 10 is calculated. Firstly, the number of vias in the height direction (Y-direction) of the IO-cell is examined. In view of the above-described conditions, the maximum number of lines that can be arranged in the height direction of the IO-logic formation area 14 in the first global wiring layer can be derived from the below-shown Expression (3).

(Number of Lines in First Global Wiring Layer)

=50[μm]/(1.0[μm]+2.0[μm])

=16.6667     (3)

Note that since the number of lines is always an integer, the number of lines in the first global wiring layer is 16 based on Expression (3). Further, the vias 40 are disposed along both sides of each of these 16 lines. Therefore, 16 vias 40 are arranged in the Y-direction in the IO-logic formation area 14.

Next, the number of vias arranged in the width direction (X-direction) of the IO-cell is examined. In view of the above-described conditions, the maximum number of convex parts that can be arranged in the width direction of the IO-logic formation area 14 can be derived by the below-shown Expression (4).

(Maximum number of convex parts that can be arranged in width direction)

=50[μm]/(1.0[μm]+2.0[μm])

=16.6667     (4)

Note that since the number of convex parts is always an integer, the maximum number of convex parts that can be arranged in the width direction is 16 based on Expression (4). Further, two vias 40 are disposed in each of these 16 convex parts. Therefore, 32 vias 40 are arranged in the X-direction in the IO-logic formation area 14.

From the above-shown calculation, it can be understood that 512 (16×32=512) vias 40 are disposed in the IO-logic formation area 14. When the number of the vias 40 disposed in the IO-logic formation area provided in the IO-cell of the semiconductor device 100 according to the comparative example is calculated in a manner similar to the above-shown calculation, the calculation shows that 4096 vias 40 are disposed in one IO-logic formation area in the semiconductor device 100 according to the comparative example.

Further, in view of the above-described conditions, the permissible current per via is 100 μA. With these values, the amount of current that can be supplied to one IO-logic formation area is calculated by calculating the product of the number of vias and the permissible current. FIG. 11 shows a table in which the calculation results are summarized. As shown in FIG. 11, the amount of current is 51.2 mA in the IO-logic formation area 14 of the semiconductor device according to the first embodiment, while the amount of current is 409.6 mA in the IO-logic formation area of the semiconductor device 100 according to the comparative example. Meanwhile, the operating current of the IO-logic formation area 14 in the above-described conditions is 50 [μA]. That is, although the maximum amount of current that can be fed to the IO-logic formation area 14 of the semiconductor device 1 according to the first embodiment is smaller than that of the semiconductor device 100 according to the comparative example, the semiconductor device 1 according to the first embodiment has a sufficient permissible current.

Next, the wiring resistance of the global lines of the semiconductor device 1 according to the first embodiment and that of the semiconductor device 100 according to the comparative example are examined. Firstly, the wiring resistance in the X-direction is examined. The wiring resistance in the X-direction depends on the number of lines arranged in the Y-direction in each global wiring layer. That is, the wiring resistance in the X-direction can be obtained by examining the parallel resistances of the lines extending in the X-direction. Therefore, FIG. 12 is a table showing a relation between the number of lines in a crosswise direction (X-direction) in the global wiring layers and a wiring resistance in the IO-cell of the semiconductor device according to the first embodiment, and a relation between the number of lines in a crosswise direction (X-direction) and a wiring resistance in the IO-cell of the semiconductor device according to the comparative example. As shown in FIG. 12, lines extending in the X-direction are provided only in the second and third global wiring layers in the semiconductor device 100 according to the comparative example. Note that in the IO-logic formation area of the semiconductor device 100 according to the comparative example, 16 lines are provided in each wiring layer as calculated from the above-shown Expression (3). In contrast to this, eight lines extending in the X-direction are disposed in the first global wiring layer and 16 lines extending in the X-direction are disposed in each of the second and third global wiring layers in the semiconductor device 1 according to the first embodiment. Therefore, the wiring resistance in the X-direction in the semiconductor device 1 according to the first embodiment, which has a larger number of lines than that of the comparative example, is lower than that of the comparative example.

Next, FIG. 13 is a table showing a relation between the number of lines in a lengthwise direction (Y-direction) in the global wiring layers and a wiring resistance in the IO-cell according to the first embodiment, and a relation between the number of lines in a lengthwise direction (Y-direction) and a wiring resistance in the IO-cell of the semiconductor device according to the comparative example. As shown in FIG. 13, lines extending in the Y-direction are provided only in the first global wiring layer in the semiconductor device 100 according to the comparative example. Note that in the IO-logic formation area of the semiconductor device 100 according to the comparative example, 16 lines are provided in the first global wiring layer as calculated from the above-shown Expression (3). In contrast to this, 16 lines extending in the X-direction are disposed in the first global wiring layer in the semiconductor device 1 according to the first embodiment. Further, in the semiconductor device 1 according to the first embodiment, two vias are disposed in a first via layer disposed between the first and second global wiring layers. Further, 250 vias are disposed in a second via layer disposed between the second and third global wiring layers.

Note that the number of vias in the second via layer is calculated based on the below-shown Expression (5).

(Number of vias in second via layer)=(Width of IO-cell)/((Via size)+(Interval between vias))

=50[μm]/(0.1[μm]+0.1[μm])

=250[vias]    (5)

Further, since the semiconductor device 1 according to the first embodiment requires a lot of vias for the connection between adjacent lines having the same voltage, the semiconductor device 1 according to the first embodiment has a higher wiring resistance than that of the semiconductor device 100 according to the comparative example. In the example shown in FIG. 13, the wiring resistance in the Y-direction of the semiconductor device 1 according to the first embodiment is about 6.6 times the wiring resistance in the Y-direction of the semiconductor device 100 according to the comparative example.

Based on the above-described examination, in the semiconductor device 1 according to the first embodiment, it has been found that it is possible to increase the number of parallel lines extending in the X-direction in which the surrounding lines extend. Therefore, it is possible to make the wiring resistance in the X-direction in the semiconductor device 1 according to the first embodiment smaller than that of the semiconductor device 100 according to the comparative example. Meanwhile, since the semiconductor device 1 according to the first embodiment has no line extending in the Y-direction, the wiring resistance in the Y-direction is higher than that of the semiconductor device 100 according to the comparative example.

However, the number of IO-cells 10 mounted in one semiconductor chip has been increasing in recent semiconductor devices. That is, the number of IO-cells 10 connected to one surrounding line has been increasing in recent semiconductor devices. Based on the above-described examination, it has been found that the wiring resistance in the X-direction is small and the wiring resistance in the Y-direction is large in the IO-cell 10 according to the first embodiment. Further, when the number of arranged IO-cells 10 is increased, the length of the surrounding lines increases. Therefore, there has been a tendency for the wiring resistance in the X-direction to increase and the wiring resistance in the Y-direction to decrease owing to the increase in the number of parallel lines.

Therefore, a relation between the wiring resistance and the number of arranged IO-cells 10 is examined hereinafter. Therefore, FIG. 14 is a table showing a relation between the number of IO-cells connected to a surrounding line(s) and the resistance value of a power supply line(s) in the semiconductor device according to the comparative example, and FIG. 15 is a table showing a relation between the number of IO-cells connected to a surrounding line(s) and the resistance value of a power supply line(s) in the semiconductor device according to the first embodiment.

As shown in FIG. 14, in the semiconductor device 100 according to the comparative example, as the number of IO-cells connected to the surrounding line increases, the wiring resistance in the X-direction monotonically increases and the wiring resistance in the Y-direction monotonically decreases. Further, in the semiconductor device 100 according to the comparative example, the total resistance of the wiring resistances in the X- and Y-directions monotonically increases. This is because the amount of decrease in the wiring resistance in the Y-direction is always smaller than the amount of increases in the X-direction.

Meanwhile, as shown in FIG. 15, in the semiconductor device 1 according to the first embodiment, as the number of IO-cells connected to the surrounding line increases, the wiring resistance in the X-direction monotonically increases and the wiring resistance in the Y-direction monotonically decreases as in the case of the comparative example. Further, in the semiconductor device 1 according to the first embodiment, the total resistance of the wiring resistances in the X- and Y-directions monotonically decreases when the number of IO-cells connected to the surrounding line is four or less. Further, the total resistance monotonically increases when the number of IO-cells connected to the surrounding line is five or greater. This is because the amount of decrease in the wiring resistance in the Y-direction is larger than the amount of increases in the X-direction when the number of arranged IO-cells is four or less.

Figure 16:
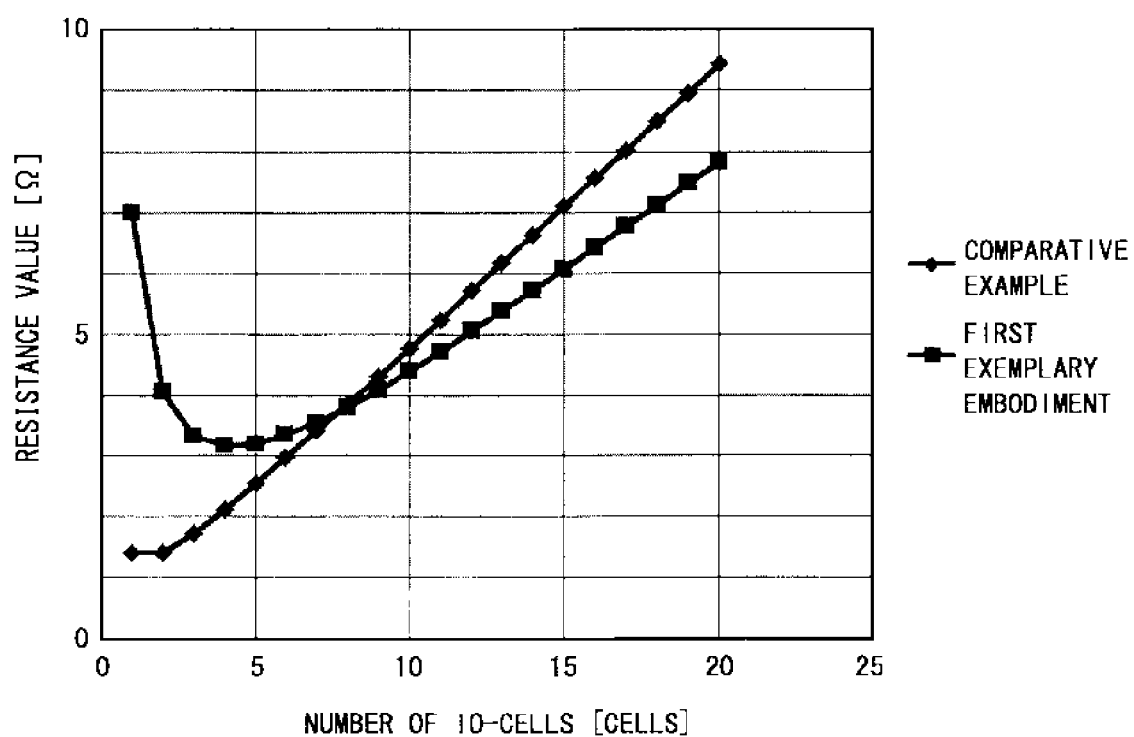
FIG. 16 is a graph in which the total resistance shown in FIG. 14 is compared with the total resistance shown in FIG. 15.

FIG. 16 shows a graph in which the total resistance shown in FIG. 14 is compared with the total resistance shown in FIG. 15. As shown in FIG. 16, when the number of arranged IO-cells 10 is small, the total resistance in the semiconductor device 1 according to the first embodiment is higher than that in the semiconductor device 100 according to the comparative example. However, when the number of arranged IO-cells is eight or greater, the total resistance in the semiconductor device 1 according to the first embodiment is lower than that in the semiconductor device 100 according to the comparative example. This is because the rate of increase of the total resistance in the semiconductor device 1 according to the first embodiment is smaller than that in the semiconductor device 100 according to the comparative example. Further, when the number of arranged IO-cells is 20, the total resistance in the semiconductor device 1 according to the first embodiment is smaller than that in the semiconductor device 100 according to the comparative example by 20%.

Based on the above explanation, it is seen that in the semiconductor device 1 according to the first embodiment, the greater the number of IO-cells 10 connected to one surrounding line is, the higher the effect of reducing the resistance value of the surrounding line becomes. Further, by the reducing of the resistance value of the surrounding line, the semiconductor device 1 according to the first embodiment can avoid the problem of the IRDrop and the like that would otherwise occur in the surrounding line. Further, as described above, the semiconductor device 1 according to the first embodiment reduces the wiring resistance in the X-direction while also reducing the number of wiring layers by eliminating any power supply lines extending in the Y-direction. As a result, the semiconductor device 1 according to the first embodiment can reduce the increase in the wiring resistance that is caused when the number of IO-cells 10 connected to one surrounding line increases. That is, in the semiconductor device 1 according to the first embodiment, the effect of reducing the wiring resistance increases with the increase in the number of IO-cell 10s connected to one surrounding line.

Further, by reducing the resistance value of the surrounding lines, it is possible to reduce the driving ability of the power supply circuit that supplies electric power to the surrounding lines, thus producing an advantageous effect that the semiconductor chip can be reduced in size. Further, to explain the configuration from a different point of view, the semiconductor device 1 according to the first embodiment can increase the number of IO-cells 10 connected to one power supply circuit while maintaining a specific IRDrop. By increasing the number of IO-cells 10 connected to one power supply circuit as described above, it is possible to reduce the number of power supply circuits and thereby reduce the size of the semiconductor chip.

Further, in most of the recent semiconductor devices, the number of IO-cells 10 is not less than 20. Therefore, the effect of reducing the wiring resistance by the IO-cells 10 according to the first embodiment is very large. Further, in recent semiconductor devices, it is desirable to reduce the number of wiring layers in order to improve the reliability of the semiconductor devices. Therefore, the effect produced by using the IO-cells 10 according to the first embodiment, which can reduce the wiring resistance even when the number of wiring layers is small, is high.

Second Embodiment

In a second embodiment, another embodiment of the shape of lines formed in the first to third global wiring layers is explained. More specifically, an example in which a concavo-convex shape is formed on a side(s) of a third power supply line formed in the second global wiring layer is explained in the second embodiment. Therefore, transistors are also arranged in the layout shown in FIG. 3 in a semiconductor device according to the second embodiment. Further, an IO-cell having a global line wiring structure according to the second embodiment is referred to as "IO-cell 60" hereinafter.

Figure 17:
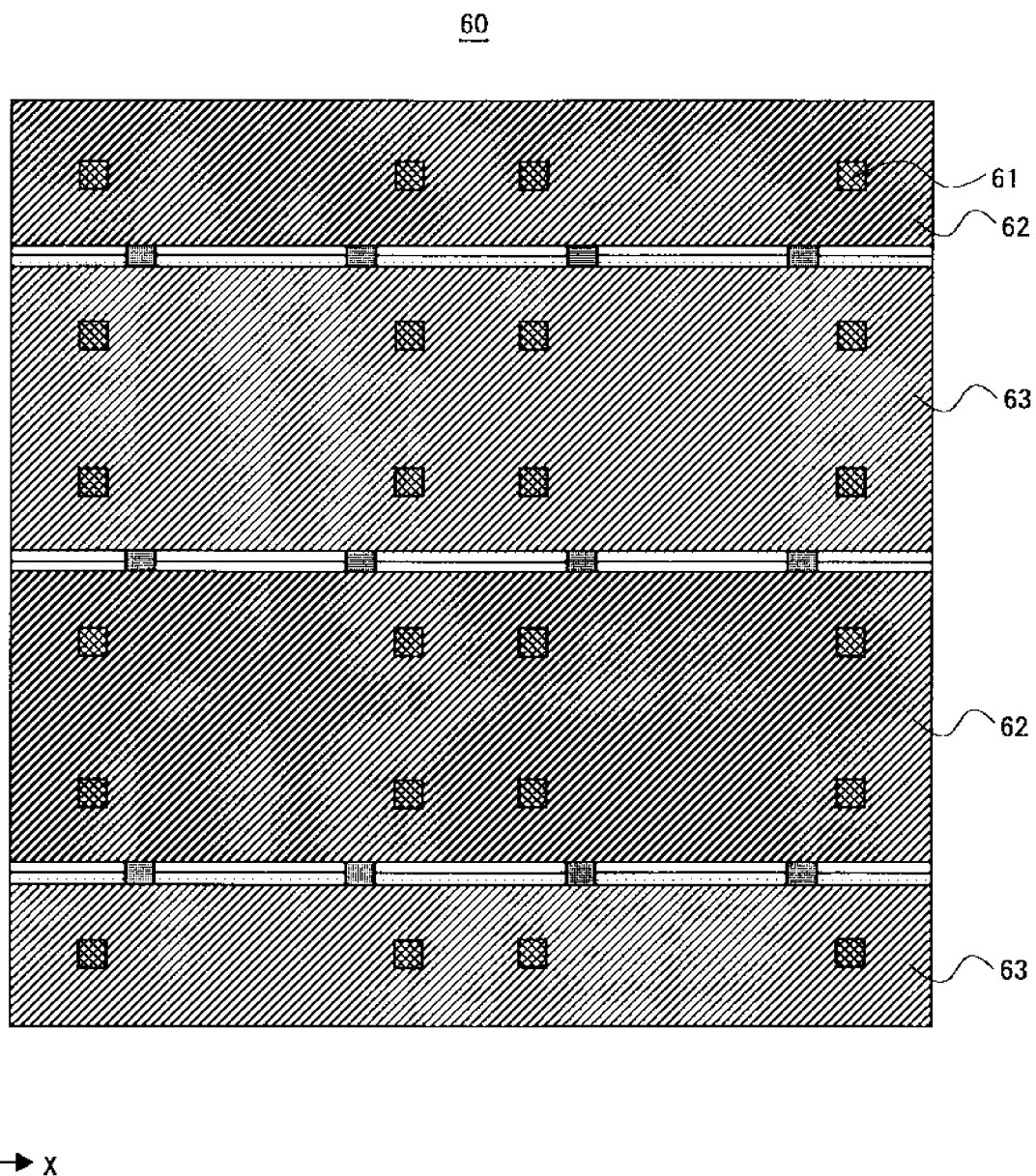
FIG. 17 is a schematic diagram showing a layout of a first global wiring layer of an IO-cell according to a second embodiment.
Figure 18:
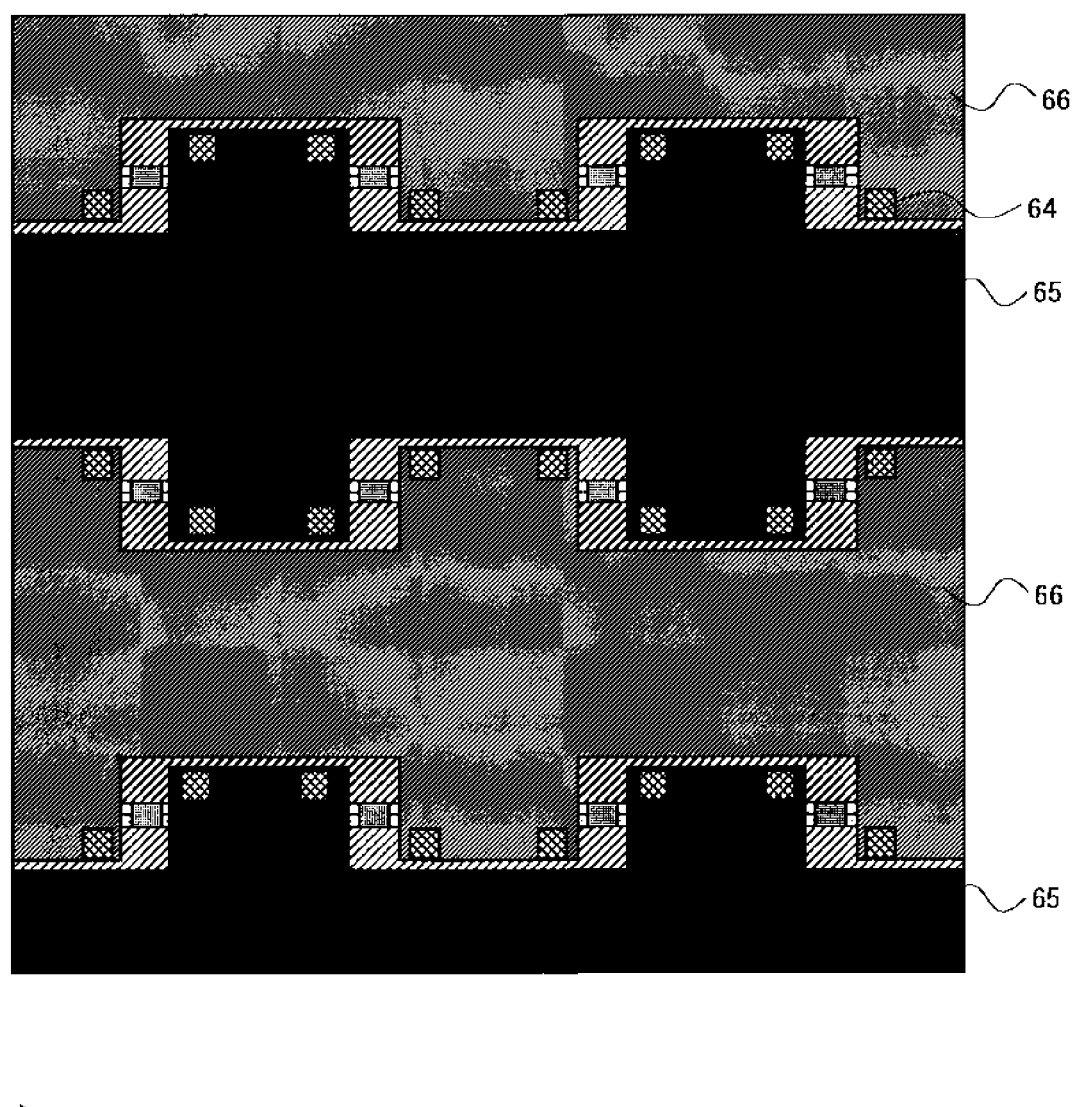
FIG. 18 is a schematic diagram showing a layout of a second global wiring layer of the IO-cell according to the second embodiment.
Figure 19:
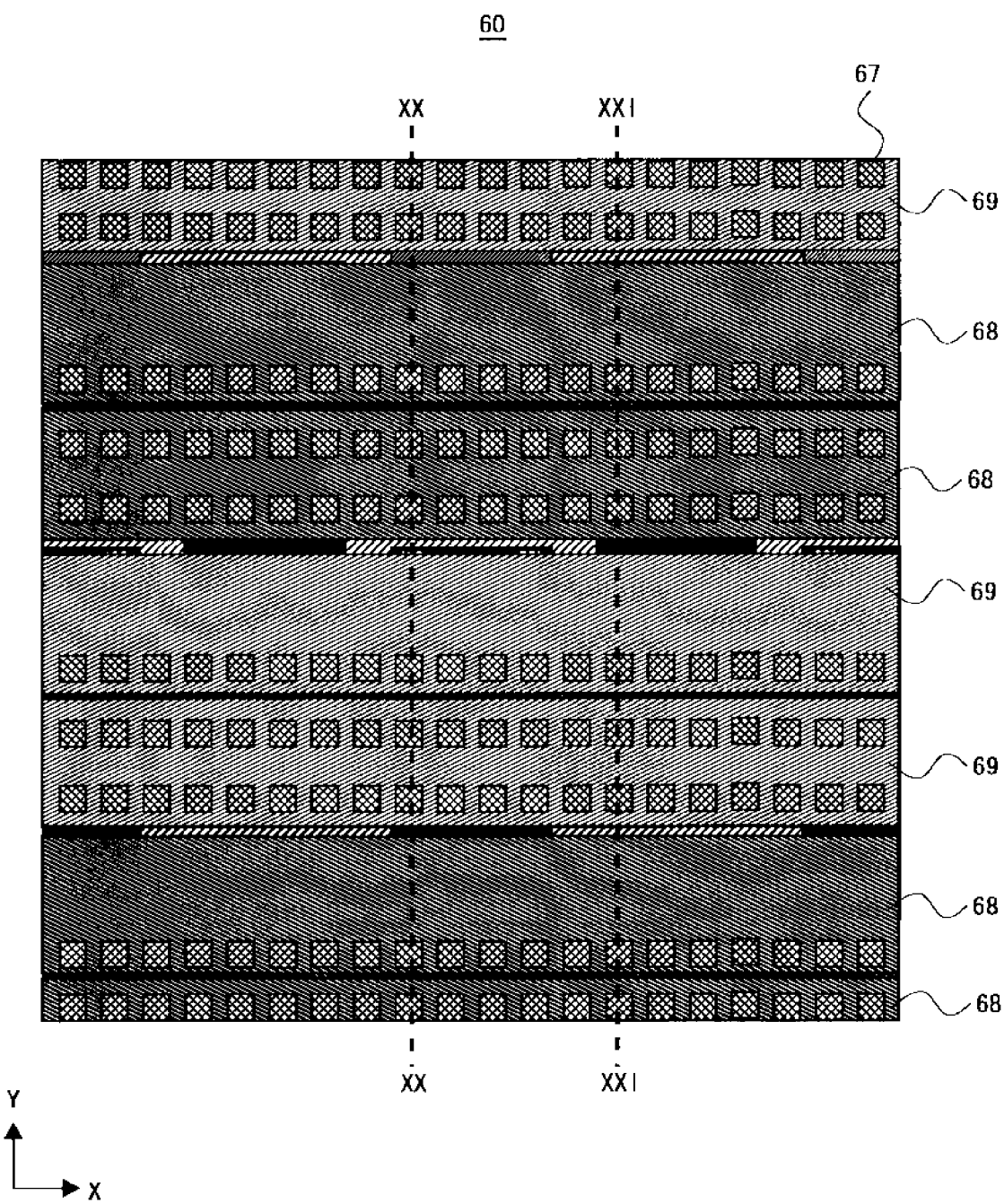
FIG. 19 is a schematic diagram showing a layout of a third global wiring layer of the IO-cell according to the second embodiment.

FIGS. 17 to 19 show layouts for first to third global wiring layers, respectively, according to the second embodiment. FIG. 17 shows a schematic diagram showing a layout of a first global wiring layer of an IO-cell 60 according to the second embodiment.

As shown in FIG. 17, first power supply lines (e.g., first layer power supply lines 62) and second power supply lines (e.g., first layer ground lines 63) are disposed in the first global wiring layer in the IO-cell 60 according to the second embodiment. That is, a power supply voltage is supplied to the first layer power supply lines 62 and a ground voltage is supplied to the first layer ground lines 63. The first layer power supply lines 62 are connected to the sources of the PMOS transistors shown in FIG. 3 through vias 61. Further, the first layer ground lines 63 are connected to the sources of the NMOS transistors shown in FIG. 3 through the vias 61. Note that the first layer power supply lines 62 and the first layer ground lines 63 are electrically connected to their respective transistors through stack vias including the vias 61 or a wiring structure formed by a local wiring layer(s) and other vias.

The first layer power supply lines 62 and the first layer ground lines 63 are formed so as to extend in a direction parallel to the X-direction. The first layer power supply lines 62 are generally disposed in a layer above the N-type well region 20, and the first layer ground lines 63 are generally disposed in a layer above the P-type well region 23. Further, in the second embodiment, the first layer power supply lines 62 and the first layer ground lines 63 have no concavo-convex shape on their sides.

Next, FIG. 18 shows a schematic diagram of a layout of a second global wiring layer of the IO-cell 60 according to the second embodiment. As shown in FIG. 18, second layer power supply lines 65 and second layer ground lines 66 are disposed in the second global wiring layer. First electric power is supplied to the second layer power supply lines 65 and second electric power is supplied to the second layer ground lines 66. Further, as shown in FIG. 18, the second layer power supply lines 65 and the second layer ground lines 66 are alternately arranged in the Y-direction in the second global wiring layer.

Further, as shown in FIG. 18, each of the second layer power supply lines 65 and the second layer ground lines 66 have a concavo-convex shape on at least one of their sides. Further, they are formed so that the convex parts of the second layer power supply lines 65 engage with the concave parts of the second layer ground lines 66. That is, the second layer power supply lines 65 and the second layer ground lines 66 are arranged so that their concavo-convex parts engage with each other.

As shown in FIG. 18 and with reference to FIG. 17, the second layer power supply lines 65 are formed above the first layer ground lines 63. However, the tips of the convex parts of each second layer power supply line 65 are formed above two adjacent first layer power supply lines 62 disposed in the first global wiring layer. Further, each second layer power supply line 65 is connected to two adjacent first layer power supply lines 62 disposed in the first global wiring layer through vias 64 provided near the tips of the convex parts of the second layer power supply line 65. That is, the second layer power supply line 65 corresponds to a third power supply line that connects two power supply lines formed in another global wiring layer with each other.

Further, as also shown in FIG. 18 and again with reference to FIG. 17, the second layer ground lines 66 are formed above the first layer power supply lines 62. However, the tips of the convex parts of each second layer ground line 66 are formed above two adjacent first layer ground lines 63 disposed in the first global wiring layer. Each second layer ground line 66 is connected to two adjacent first layer ground lines 63 disposed in the first global wiring layer through vias 64 provided near the tips of the convex parts of the second layer ground line 66. That is, the second layer ground line 66 corresponds to a fourth power supply line that connects two ground lines formed in another global wiring layer with each other.

In the second embodiment, both of the third and fourth power supply lines, each of which connects lines formed in another global wiring layer with each other, can be formed in one global wiring layer. That is, the tips of the convex parts of the second layer power supply lines 65 and the second layer ground lines 66 are formed in positions that are located beyond imaginary extension lines that are projected in the Z-direction from the boundaries between the N-type well regions 20 and the P-type well regions 23.

Next, FIG. 19 shows a schematic diagram of a layout of a third global wiring layer of the IO-cell 60 according to the second embodiment. As shown in FIG. 19, third layer power supply lines 68 and third layer ground lines 69 are disposed in the third global wiring layer. First electric power is supplied to the third layer power supply lines 68 and second electric power is supplied to the third layer ground lines 69. In the example shown in FIG. 19, each of the third layer power supply lines 68 and the third layer ground lines 69 are formed in such a manner that two lines form one line pair. Each of the two lines forming a line pair of the third layer power supply lines 68 is connected to the second layer power supply lines 65 through vias 67. Each of the two lines forming a line pair of the third layer ground lines 69 is connected to the second layer ground lines 66 through the vias 67. In FIG. 19, a line pair formed by two lines can be regarded as one line. Further, as shown in FIG. 19, a plurality of line pairs, to which different voltages are supplied, are alternately arranged in the Y-direction in the third global wiring layer.

Note that it is desirable that the vias 67, which connect lines formed in the second global wiring layer with lines formed in the third global wiring layer, are disposed as many as possible. This is because by disposing as many vias 67 as possible, the resistance value of the third and fourth power supply lines can be reduced.

Next, a cross sectional structure of the global wiring layers and their peripheral elements of the semiconductor device according to the second embodiment is explained. Note that since the cross sectional structure of transistors in the second embodiment is identical to that in the first embodiment, its explanation is omitted. That is, only the lines formed in the global wiring layers are explained.

Figure 20:
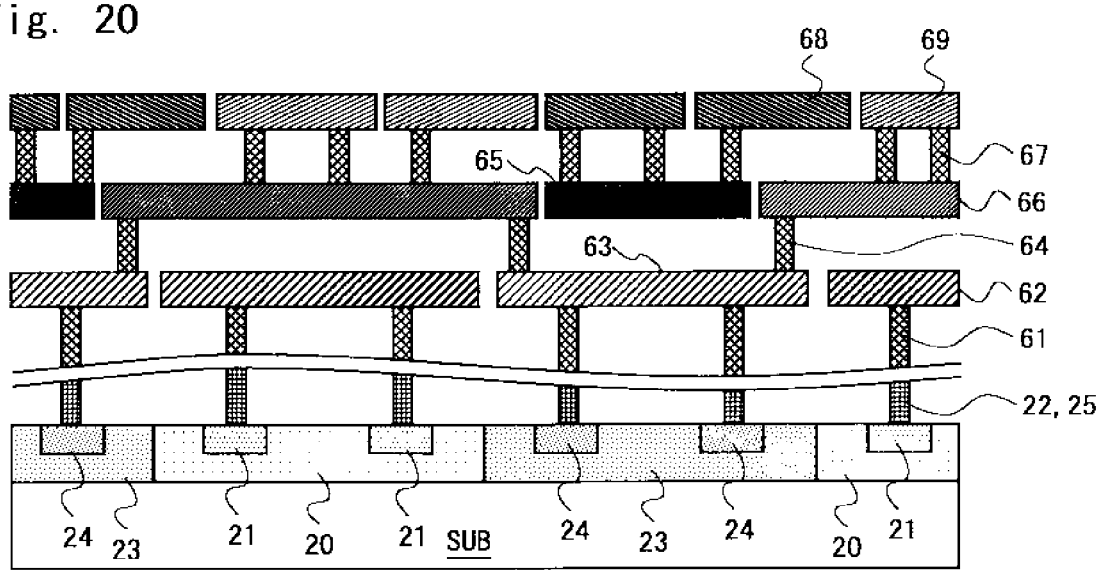
FIG. 20 is a cross section of the IO-cell taken along a line XX-XX of FIG. 19.
Figure 20:
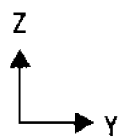

FIG. 20 shows a cross section of the IO-cell taken along a line XX-XX of FIG. 19. As shown in FIG. 20, the line width of the first layer power supply line 62 is roughly equal to that of the first layer ground line 63 in the first global wiring layer in the cross section taken along the line XX-XX. Further, the line width (line width in Y-direction) of the second layer ground line 66 is wider than that of the second layer power supply line 65 in the second global wiring layer in the cross section taken along the line XX-XX. The second layer power supply line 65 is formed above the first layer ground line 63 and the second layer ground line 66 is formed above the first layer power supply line 62. Further, as shown in FIG. 20, lines formed in the third global wiring layer are connected to each other by a line that is formed in the second global wiring layer and has the same voltage as the lines to be connected and vias 67 in the second embodiment.

Figure 21:
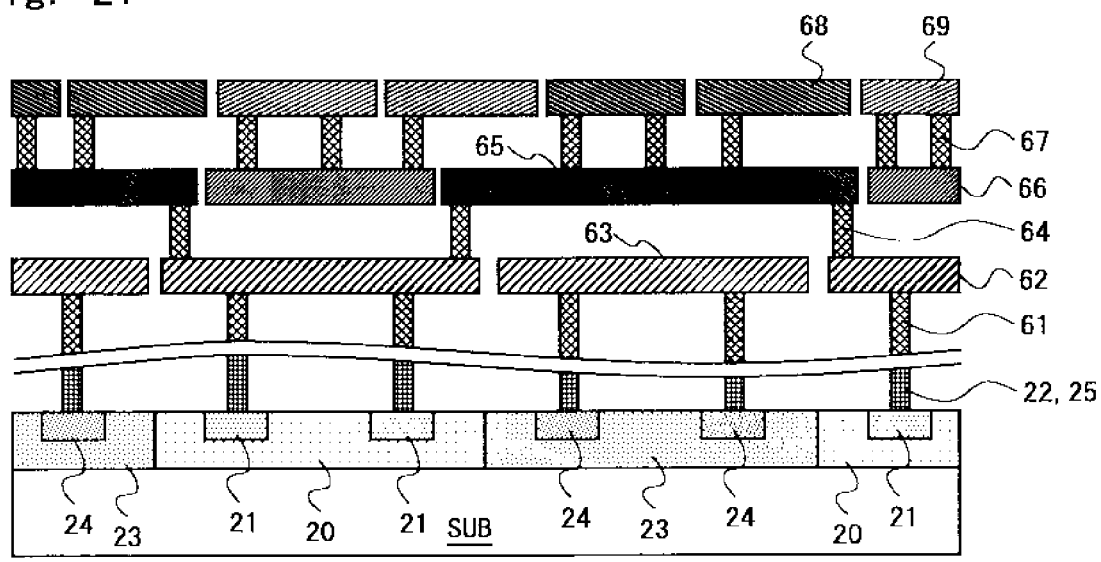
FIG. 21 is a cross section of the IO-cell taken along a line XXI-XXI of FIG. 19.
Figure 21:
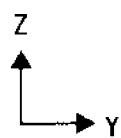

FIG. 21 shows a cross section of the IO-cell taken along a line XXI-XXI of FIG. 19. As shown in FIG. 21, the line width of the first layer power supply line 62 is also roughly equal to that of the first layer ground line 63 in the first global wiring layer in the cross section taken along the line XXI-XXI. Further, the line width (line width in Y-direction) of the second layer power supply line 65 is wider than that of the second layer ground line 66 in the second global wiring layer in the cross section taken along the line XXI-XXI. The second layer power supply line 65 is formed above the first layer ground line 63 and the second layer ground line 66 is formed above the first layer power supply line 62. Further, as shown in FIG. 21, lines formed in the third global wiring layer are connected to each other by a line that is formed in the second global wiring layer and has the same voltage as the lines to be connected and vias 67 in the second embodiment.

As shown in FIGS. 20 and 21, the global wiring layers have such a structure that lines to which electric powers having different voltages are supplied are stacked in the vertical direction (e.g., Z-direction) of the semiconductor chip above the transistors in the semiconductor device according to the second embodiment. In particular, it is important that the second power supply line and the third power supply line, which has a voltage different from that of the second power supply line, are stacked in the vertical direction (e.g., Z-direction) of the semiconductor chip.

As explained above, power supply lines having a concavo-convex shape on their sides is provided in the second global wiring layer in the semiconductor device according to the second embodiment. That is, power supply lines having a concavo-convex shape on their sides may be disposed in any of the global wiring layers. By providing a power supply line having a concavo-convex shape on its side(s) in at least one of the global wiring layers, an advantageous effect similar to that of the semiconductor device according to the first embodiment can be achieved. More specifically, by employing the above-described feature, it is possible to achieve the wiring resistance reduction effect when the number of IO-cells connected to one surrounding line is increased.

Third Embodiment

In a third embodiment, another embodiment of the shape of lines formed in the first to third global wiring layers is explained. More specifically, an example in which lines formed in the second global wiring layer and lines formed in the third global wiring layer both have a concavo-convex shape on their sides is explained in the third embodiment. That is, in the third embodiment, a third line, which connects two adjacent lines that are disposed in a layer below the third line and have the same voltage as that of the third line, to each other is formed in both the second and third global wiring layers. Therefore, transistors are also arranged in the layout shown in FIG. 3 in a semiconductor device according to the third embodiment. Further, an IO-cell having a global line wiring structure according to the third embodiment is referred to as "IO-cell 70" hereinafter.

Figure 22:
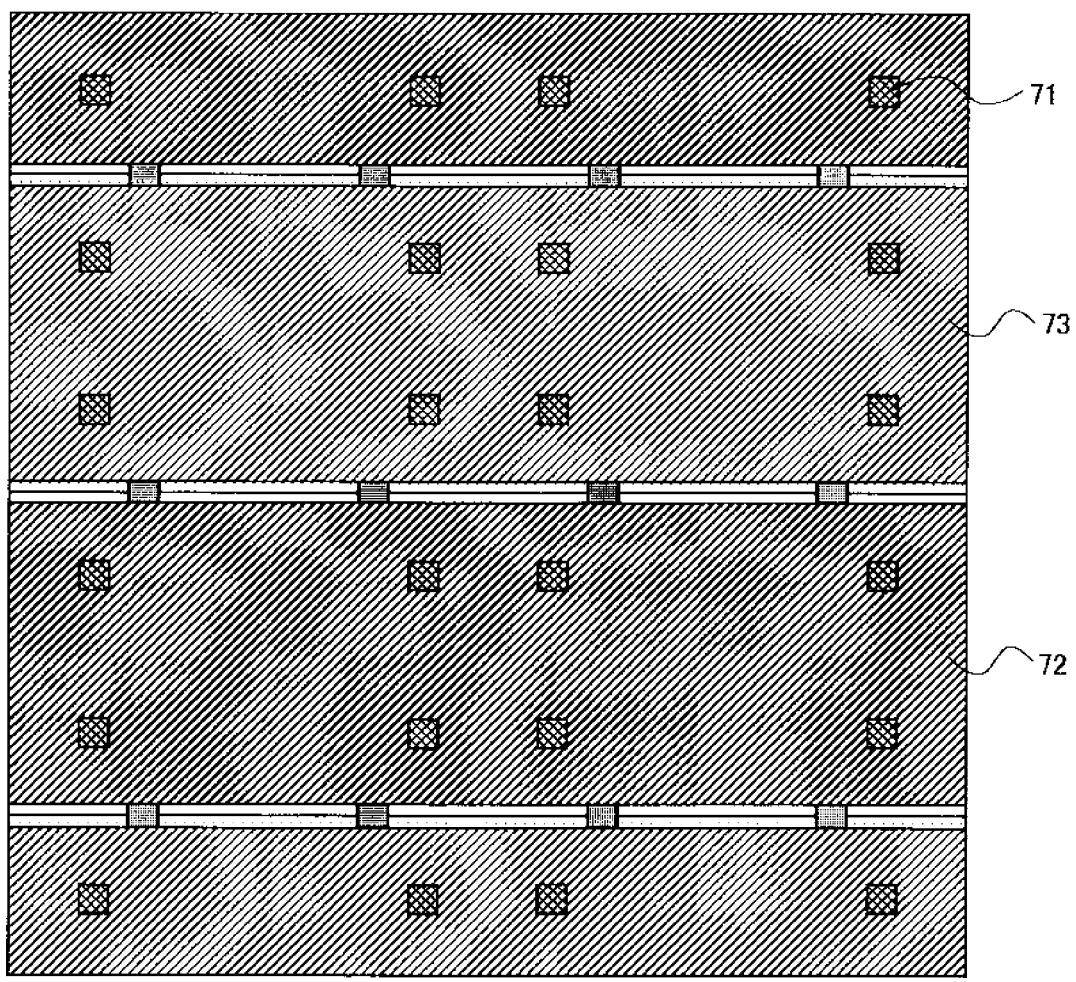
FIG. 22 is a schematic diagram showing a layout of a first global wiring layer of an IO-cell according to a third embodiment.
Figure 23:
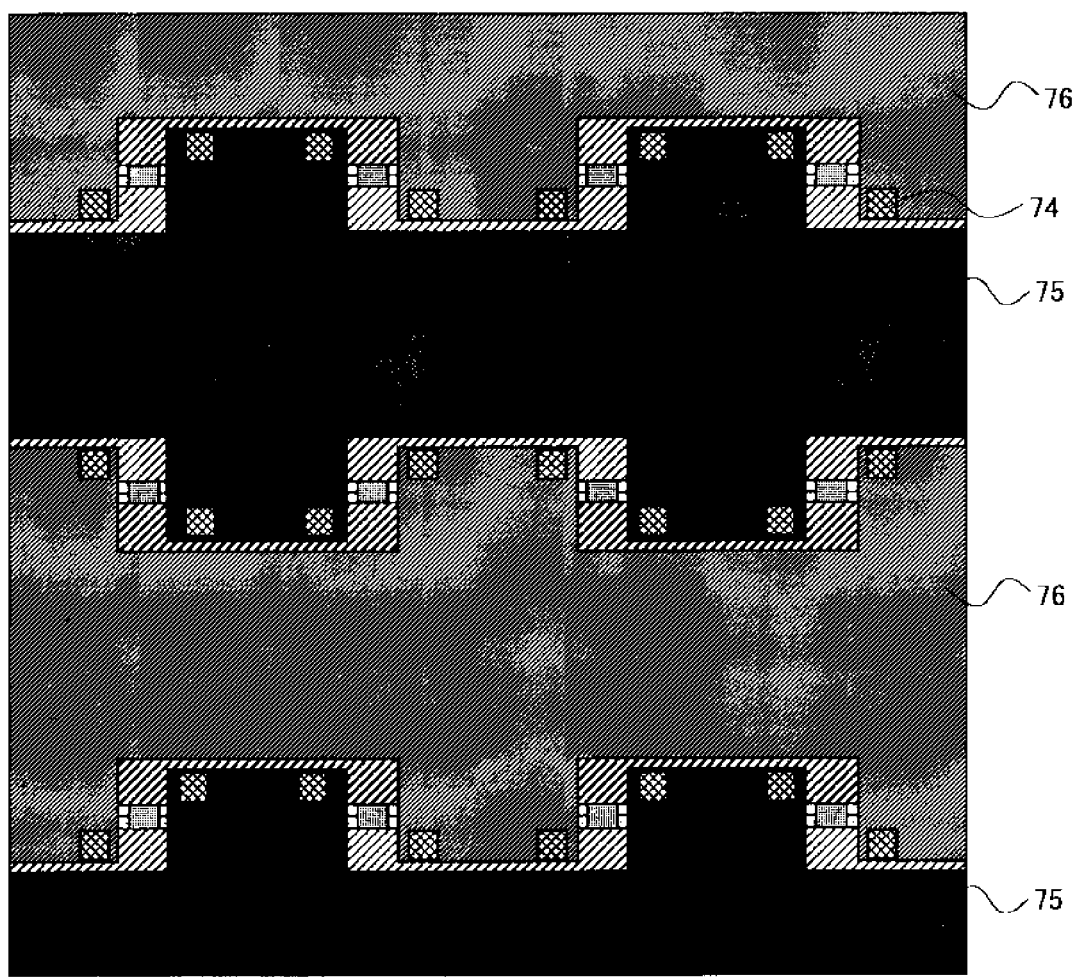
FIG. 23 is a schematic diagram showing a layout of a second global wiring layer of the IO-cell according to the third embodiment.
Figure 24:
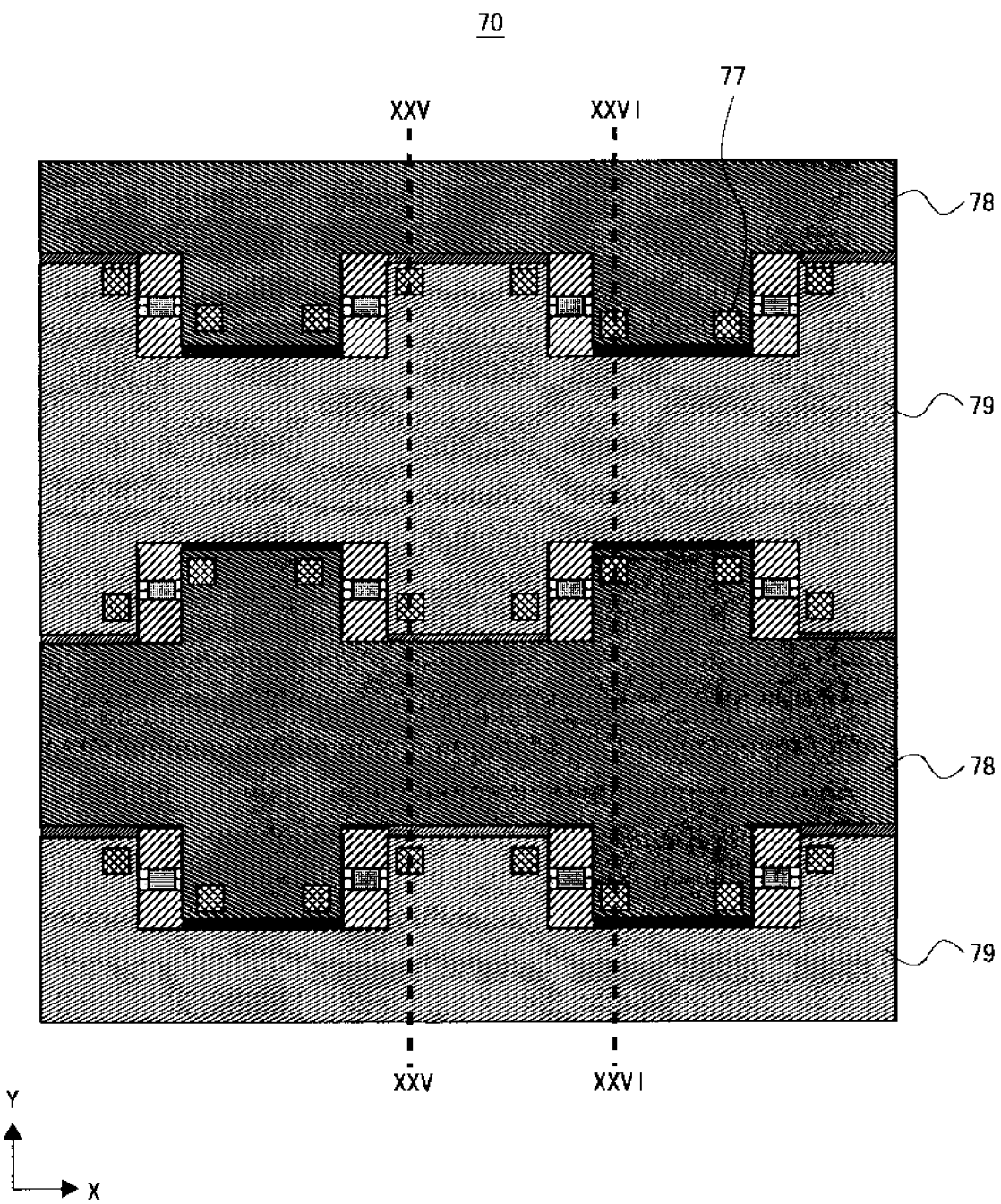
FIG. 24 is a schematic diagram showing a layout of a third global wiring layer of the IO-cell according to the third embodiment.

FIGS. 22 to 24 show layouts for first to third global wiring layers, respectively, according to the third embodiment. FIG. 22 shows a schematic diagram of a layout of a first global wiring layer of an IO-cell 70 according to the third embodiment.

As shown in FIG. 22, first power supply lines (e.g., first layer power supply lines 72) and second power supply lines (e.g., first layer ground lines 73) are disposed in the first global wiring layer in the IO-cell 70 according to the second embodiment. That is, a power supply voltage is supplied to the first layer power supply lines 72 and a ground voltage is supplied to the first layer ground lines 73. The first layer power supply lines 72 are connected to the sources of the PMOS transistors shown in FIG. 3 through vias 71. Further, the first layer ground lines 73 are connected to the sources of the NMOS transistors shown in FIG. 3 through the vias 71. Note that the first layer power supply lines 72 and the first layer ground lines 73 are electrically connected to their respective transistors through stack vias including the vias 71 or a wiring structure formed by a local wiring layer(s) and other vias.

The first layer power supply lines 72 and the first layer ground lines 73 are formed so as to extend in a direction parallel to the X-direction. The first layer power supply lines 72 are generally disposed in a layer above the N-type well region 20, and the first layer ground lines 73 are generally disposed in a layer above the P-type well region 23. Further, in the third embodiment, the first layer power supply lines 72 and the first layer ground lines 73 have no concavo-convex shape on their sides.

Next, FIG. 23 shows a schematic diagram of a layout of a second global wiring layer of the IO-cell 70 according to the third embodiment. As shown in FIG. 23, second layer power supply lines 75 and second layer ground lines 76 are disposed in the second global wiring layer. First electric power is supplied to the second layer power supply lines 75 and second electric power is supplied to the second layer ground lines 76. Further, as shown in FIG. 23, the second layer power supply lines 75 and the second layer ground lines 76 are alternately arranged in the Y-direction in the second global wiring layer.

Further, as shown in FIG. 23, each of the second layer power supply lines 75 and the second layer ground lines 76 have a concavo-convex shape on at least one of their sides. Further, they are formed so that the convex parts of the second layer power supply lines 75 engage with the concave parts of the second layer ground lines 76. That is, the second layer power supply lines 75 and the second layer ground lines 76 are arranged so that their concavo-convex parts engage with each other.

As shown in FIG. 23 and with reference to FIG. 22, the second layer power supply lines 75 are formed above the first layer ground lines 73. However, the tips of the convex parts of each second layer power supply line 75 are formed above two adjacent first layer power supply lines 72 disposed in the first global wiring layer. Further, each second layer power supply line 75 is connected to two adjacent first layer power supply lines 72 disposed in the first global wiring layer through vias 74 provided near the tips of the convex parts of the second layer power supply line 75. That is, the second layer power supply line 75 corresponds to a third power supply line that connects two power supply lines formed in another global wiring layer with each other.

Further, as also shown in FIG. 23 and again with reference to FIG. 22, the second layer ground lines 76 are formed directly above the first layer power lines 72. However, the tips of the convex parts of each second layer ground line 76 are formed above two adjacent first layer ground lines 73 disposed in the first global wiring layer. Each second layer ground line 76 is connected to two adjacent first layer ground lines 73 disposed in the first global wiring layer through vias 74 provided near the tips of the convex parts of the second layer ground line 76. That is, the second layer ground line 76 corresponds to a fourth power supply line that connects two ground lines formed in another global wiring layer with each other.

In the third embodiment, both of the third and fourth power supply lines, each of which connects lines formed in another global wiring layer with each other, can be formed in one global wiring layer. That is, the tips of the convex parts of the second layer power supply lines 75 and the second layer ground lines 76 are formed in positions that are located beyond imaginary extension lines that are projected in the Z-direction from the boundaries between the N-type well regions 20 and the P-type well regions 23.

Next, FIG. 24 shows a schematic diagram of a layout of a third global wiring layer of the IO-cell 70 according to the third embodiment. As shown in FIG. 24, third layer power supply lines 78 and third layer ground lines 79 are disposed in the third global wiring layer. First electric power is supplied to the third layer power supply lines 78 and second electric power is supplied to the third layer ground lines 79. Further, as shown in FIG. 24, the third layer power supply lines 78 and the third layer ground lines 79 are alternately arranged in the Y-direction in the third global wiring layer.

Further, as shown in FIG. 24, each of the third layer power supply lines 78 and the third layer ground lines 79 have a concavo-convex shape on at least one of their sides. Further, they are formed so that the convex parts of the third layer power supply lines 78 engage with the concave parts of the third layer ground lines 79. That is, the third layer power supply lines 78 and the third layer ground lines 79 are arranged so that their concavo-convex parts engage with each other.

As shown in FIG. 24 and with reference to FIG. 23, the third layer power supply lines 78 are formed above the second layer ground lines 76. However, the tips of the convex parts of each third layer power supply line 78 are formed above the convex parts of two adjacent second layer power supply lines 75 disposed in the second global wiring layer. Further, each third layer power supply line 78 is connected to the convex parts of two adjacent second layer power supply lines 75 disposed in the second global wiring layer through vias 77 provided near the tips of the convex parts of the third layer power supply line 78. That is, the third layer power supply line 78 corresponds to a third power supply line that connects two power supply lines formed in the second global wiring layer with each other. Note that, to explain the configuration from a different point of view, two adjacent second layer power supply lines 75 disposed in the second global wiring layer serve as a first power supply line.

Further, as also shown in FIG. 24 and again with reference to FIG. 23, the third layer ground lines 79 are formed above the second layer power supply lines 75. However, the tips of the convex parts of each third layer ground line 79 are formed above two adjacent second layer ground lines 76 disposed in the second global wiring layer. Each third layer ground line 79 is connected to the convex parts of two adjacent second layer ground lines 76 disposed in the second global wiring layer through vias 77 provided near the tips of the convex parts of the third layer ground line 79. That is, the third layer ground line 79 corresponds to a fourth power supply line that connects two ground lines formed in the second global wiring layer with each other. Note that, to explain the configuration from a different point of view, two adjacent second layer ground lines 76 disposed in the second global wiring layer serve as a second power supply line.

In the third embodiment, both of the third and fourth power supply lines, each of which connects lines formed in another global wiring layer with each other, can be formed in one global wiring layer. That is, the tips of the convex parts of the second layer power supply lines 75 and the second layer ground lines 76 are formed in positions that are located beyond imaginary extension lines that are projected in the Z-direction from the boundaries between the N-type well regions 20 and the P-type well regions 23.

As explained above, in the third embodiment, the second global wiring layer serves as a second wiring layer including a third power supply line therein in a relation with the first global wiring layer, and serves as a third wiring layer including first and second power supply lines therein in a relation with the third global wiring layer.

Next, a cross sectional structure of the global wiring layers and their peripheral elements of the semiconductor device according to the third embodiment is explained. Note that since the cross sectional structure of transistors in the third embodiment is identical to that in the first embodiment, its explanation is omitted. That is, only the lines formed in the global wiring layers are explained.

Figure 25:
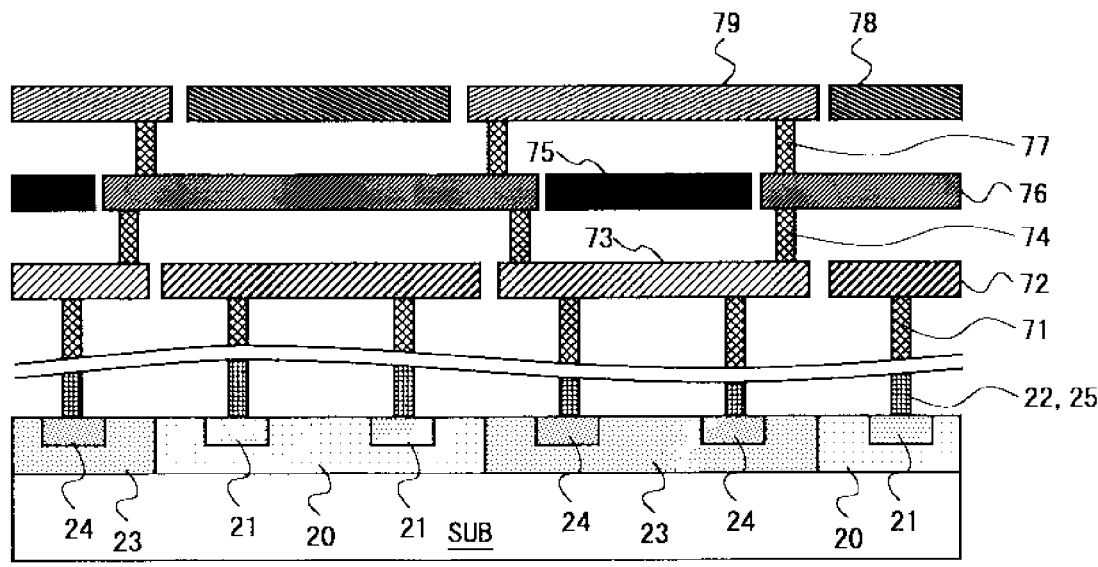
FIG. 25 is a cross section of the IO-cell taken along a line XXV-XXV of FIG. 24.
Figure 25:
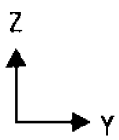

FIG. 25 shows a cross section of the IO-cell taken along a line XXV-XXV of FIG. 24. As shown in FIG. 25, the line width of the first layer power supply line 72 is roughly equal to that of the first layer ground line 73 in the first global wiring layer in the cross section taken along the line XXV-XXV. Further, the line width (line width in Y-direction) of the second layer ground line 76 is wider than that of the second layer power supply line 75 in the second global wiring layer in the cross section taken along the line XXV-XXV. The second layer power supply line 75 is formed above the first layer ground line 73 and the second layer ground line 76 is formed above the first layer power supply line 72. Further, as also shown in FIG. 25, the line width (line width in Y-direction) of the third layer ground line 79 is wider than that of the third layer power supply line 78 in the third global wiring layer in the cross section taken along the line XXV-XXV. Further, the third layer power supply line 78 is formed above the second layer ground line 76 and the third layer ground line 79 is formed above the second layer power supply line 75.

Figure 26:
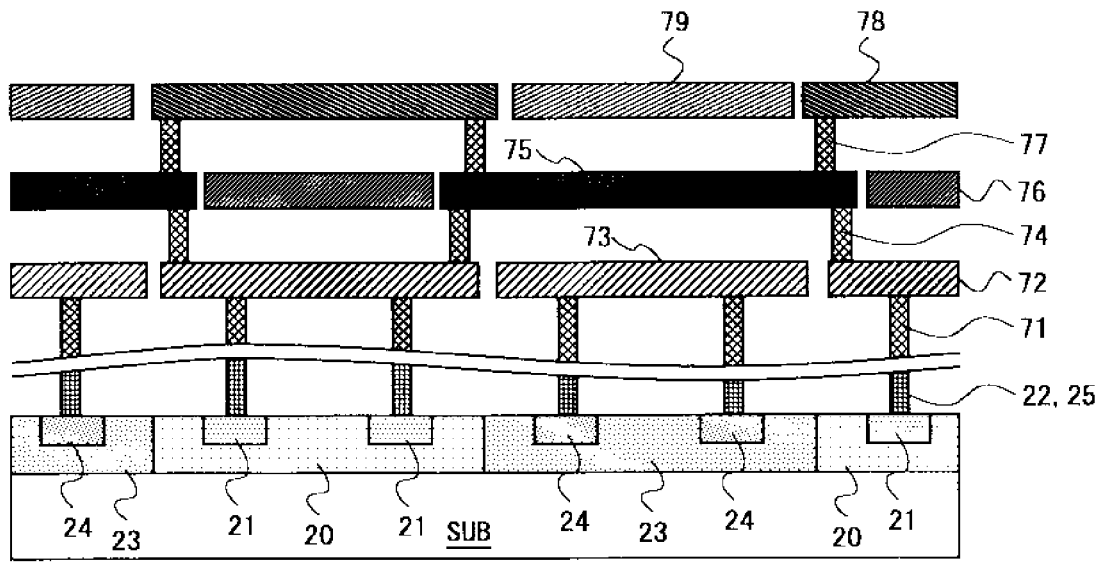
FIG. 26 is a cross section of the IO-cell taken along a line XXVI-XXVI of FIG. 24.
Figure 26:
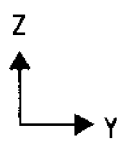

FIG. 26 shows a cross section of the IO-cell taken along a line XXVI-XXVI of FIG. 24. As shown in FIG. 26, the line width of the first layer power supply line 72 is also roughly equal to that of the first layer ground line 73 in the first global wiring layer in the cross section taken along the line XXVI-XXVI. Further, the line width (line width in Y-direction) of the second layer power supply line 75 is wider than that of the second layer ground line 76 in the second global wiring layer in the cross section taken along the line XXVI-XXVI. The second layer power supply line 75 is formed above the first layer ground line 73 and the second layer ground line 76 is formed above the first layer power supply line 72. Further, as also shown in FIG. 26, the line width (line width in Y-direction) of the third layer power supply line 78 is wider than that of the third layer ground line 79 in the second global wiring layer in the cross section taken along the line XXVI-XXVI. Further, the third layer power supply line 78 is formed above the second layer ground line 76 and the third layer ground line 79 is formed above the second layer power supply line 75.

As shown in FIGS. 25 and 26, the global wiring layers have such a structure that lines to which electric powers having different voltages are supplied are stacked in the vertical direction (e.g., Z-direction) of the semiconductor chip above the transistors in the semiconductor device according to the third embodiment. In particular, it is important that the second power supply line and the third power supply line, which has a voltage different from that of the second power supply line, are stacked in the vertical direction (e.g., Z-direction) of the semiconductor chip.

Based on the above explanation, in the semiconductor device according to the third embodiment, when attention is paid to two vertically adjacent wiring layers among the three global wiring layers, lines disposed in the lower wiring layer serve as first and second power supply lines and lines disposed in the upper wiring layer sever as a third power supply line that connects first power supply lines to each other. The first and second wiring layers described in the claims are not limited to the configurations in which each of the first and second wiring layers is formed by one layer. That is, other various forms can be feasible. Even when the above-described configuration according to the third embodiment is adopted, an advantageous effect similar to that of the semiconductor device according to the first embodiment can be achieved. More specifically, by employing the above-described feature, it is possible to achieve the wiring resistance reduction effect when the number of IO-cells connected to one surrounding line is increased.

Fourth Embodiment

Figure 27:
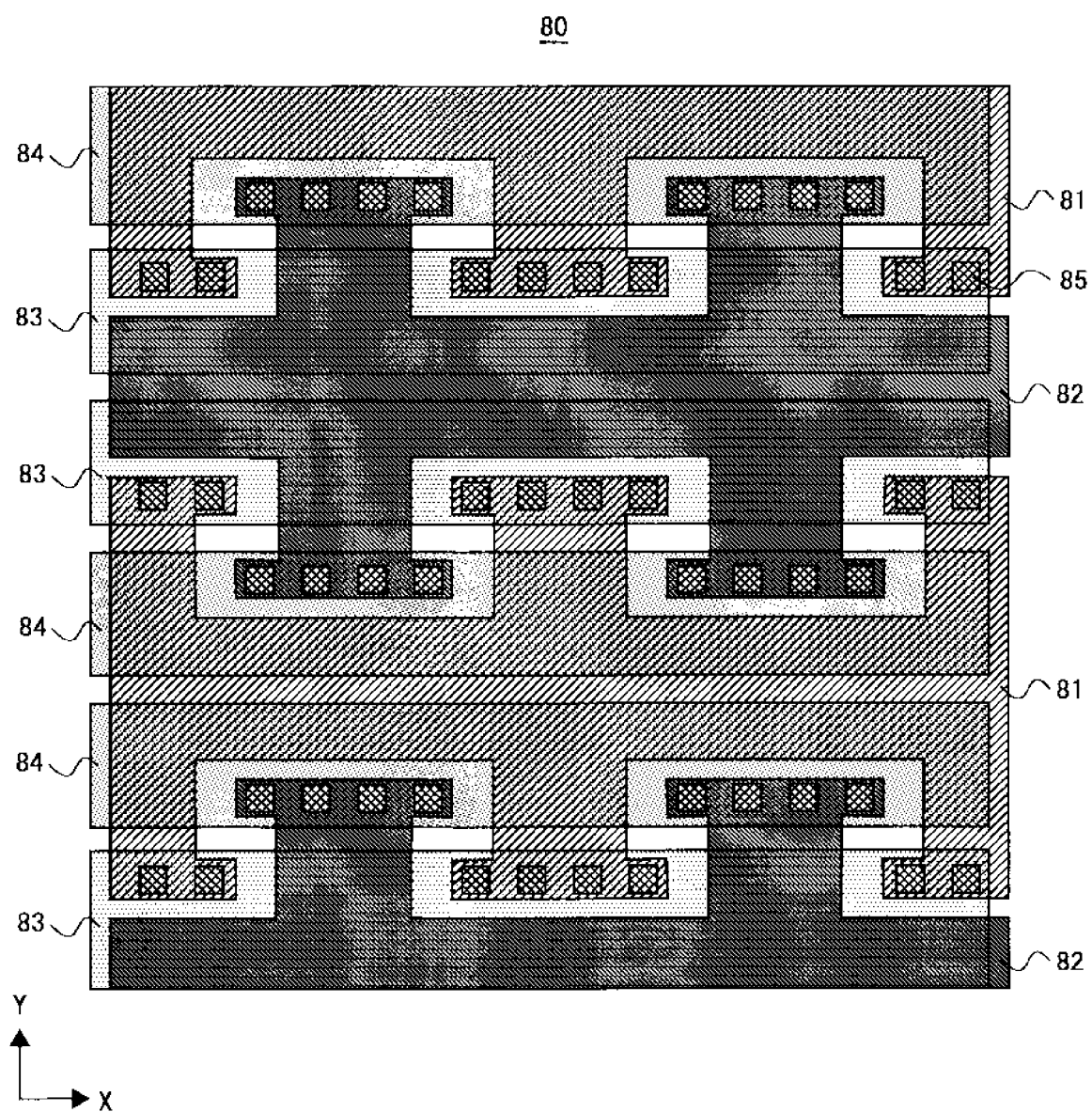
FIG. 27 is a schematic diagram showing a layout of a first global wiring layer and a second global wiring layer of an IO-cell according to a forth embodiment.

In a fourth embodiment, another embodiment of the shape of convex parts provided in a surrounding line is explained. Therefore, FIG. 27 shows a schematic diagram of a layout of first and second global wiring layers of an IO-cell 80 according to the fourth embodiment. Note that in FIG. 27, lines provided in the second global wiring layer are drawn in a translucent manner so that lines disposed in the first and second global wiring layers are both shown in the same figure.

In the example shown in FIG. 27, a first layer power supply line 81 and a first layer ground line 82 provided in the first global wiring layer both has a concavo-convex shape on their sides. Further, in the IO-cell 80 according to the fourth embodiment, two adjacent first layer power supply lines 81 in the first global wiring layer are connected to each other by a second layer power supply line 83 provided in the second global wiring layer and a power supply line (not shown) formed in the third global wiring layer. Further, in the IO-cell 80 according to the fourth embodiment, two adjacent first layer power ground lines 82 in the first global wiring layer are connected to each other by a second layer ground line 84 provided in the second global wiring layer and a ground line (not shown) formed in the third global wiring layer. Lines in the first and second global wiring layers are connected to each other through vias 85.

Note that as shown in FIG. 27, in the IO-cell 80 according to the fourth embodiment, the convex parts, which are provided on the sides of the first layer power supply line 81 and the first layer ground line 82, have wide parts at their tips. These wide parts of the convex parts have a width (length in X-direction) larger than that of the base parts of the convex parts. Further, vias 85 are disposed in these wide parts in the fourth embodiment. By disposing vias 85 in the wide pars as described above, the fourth embodiment can increase the maximum number of vias that can be disposed in one convex part compared to those of the other embodiments.

As explained above, wide parts are provided at the tips of the convex parts of the lines provided in the global wiring layers and vias are disposed in these wide parts in the fourth embodiment. As a result, it is possible to increase the number of vias 85 disposed in the convex parts and thereby reduce the resistance value in the Y-direction of the surrounding lines in the IO-cell 80 according to the fourth embodiment.

Fifth Embodiment

Figure 28:
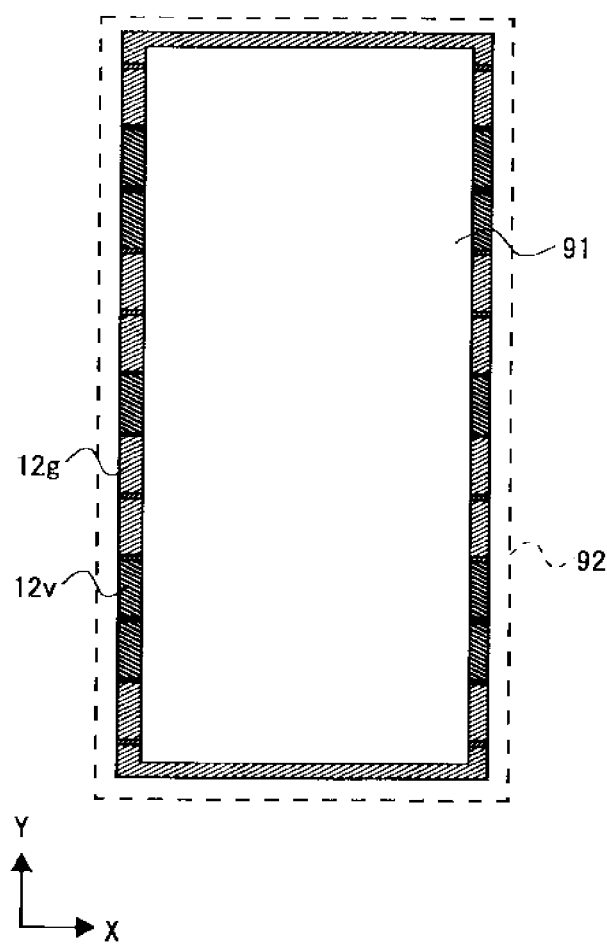
FIG. 28 is a schematic diagram showing a layout of an IO-cell according to a fifth embodiment.

In a fifth embodiment, another embodiment of the positional relation between the pad and the IO-logic formation area of an IO-cell is explained. Therefore, FIG. 28 shows a schematic diagram of a layout of an IO-cell according to a fifth embodiment. As shown in FIG. 28, a pad 91 is provided in a layer above an IO-logic formation area 92 in the fifth embodiment.

As a result, in the fifth embodiment, the pad 91 can be disposed within the area of the IO-logic formation area 92. That is, by employing the layout according to the fifth embodiment, the size of the IO-cell can be reduced.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

For example, even in the case where power supply lines having the same voltage are adjacent to each other in the same wiring layer, when pairs of those power supply lines having the same voltage are alternately arranged, the group of these power supply lines having the same voltage can be regarded as one line.

What is claimed is:

1. A semiconductor device comprising:
a first wiring layer in which a plurality of first power supply lines supplied with first electric power and a plurality of second power supply lines supplied with second electric power are alternately arranged in a first direction;
a second wiring layer in which a third power supply line connected to adjacent first power supply lines among the plurality of first power supply lines through first vias is disposed, the third power supply line being supplied with the first electric power; and
an upper wiring layer having an upper layer power supply line connected to the first electric power, the upper layer power supply line being electrically connected through second vias to the third power supply line of the second wiring layer, wherein
all of the first, second and third power supply lines are formed so as to extend in a second direction perpendicular to the first direction;
the number of second vias that electrically connect the third power supply line and the upper layer power supply line is larger than the number of first vias that electrically connect the first power supply line and the third power supply line;
the plurality of first power supply lines do not have a concavo-convex shape along their sides, and
the third power supply line has a concavo-convex shape along at least one of its sides.

2. The semiconductor device according to claim 1, wherein
the adjacent first power supply lines are both connected to convex parts of the third power supply line through the first vias.

3. The semiconductor device according to claim 2, wherein
a fourth power supply line connected to adjacent second power supply lines through third vias is disposed in the second wiring layer, the fourth power supply line being supplied with the second electric power,
the fourth power supply lines have a concavo-convex shape along at least one of their sides, and
the third and fourth power supply lines are arranged so that a convex part of the third power supply line engages with a concave part of the fourth power supply line.

4. An IO-cell comprising at least a buffer circuit formed therein, the IO-cell further comprising:
a first wiring layer in which a plurality of first power supply lines for supplying first electric power to the buffer circuit and a plurality of second power supply lines for supplying second electric power to the buffer circuit are alternately arranged in a first direction; and
a second wiring layer in which a third power supply line connected to adjacent first power supply lines among the plurality of first power supply lines through first vias is disposed, the third power supply line being supplied with the first electric power; and
an upper wiring layer having an upper layer power supply line connected to the first electric power, the upper layer power supply line being electrically connected through second vias to the third power supply line of the second wiring layer, wherein
all of the first, second and third power supply lines are formed so as to extend in a second direction perpendicular to the first direction,
the number of the second vias that electrically connect the third power supply line and the upper layer power supply line is larger than the number of the first vias that electrically connect the first power supply line and the third power supply line,
the plurality of first power supply lines do not have a concavo-convex shape along their sides, and
the third power supply line has a concavo-convex shape along at least one of its sides.

5. The IO-cell according to claim 4, wherein
the adjacent first power supply lines are both connected to convex parts of the third power supply line through the first vias.

6. The IO-cell according to claim 5, wherein
a fourth power supply line connected to adjacent second power supply lines through third via is disposed in the second wiring layer, the fourth power supply line being supplied with the second electric power,
the fourth power supply lines have a concavo-convex shape along at least one of their sides, and
the third and fourth power supply lines are arranged so that a convex part of the third power supply line engages with a concave part of the fourth power supply line.

7. A semiconductor device comprising:
a first wiring layer in which a plurality of first power supply lines connected to first electric power and a plurality of second power supply lines connected to second electric power are arranged side-by-side in a first direction with first power supply lines being alternated with second power supply lines in said first direction;
a second wiring layer in which a third power supply line is disposed, the third power supply line being electrically connected through first vias to spaced apart first and second ones of said plurality of first power supply lines; and
an upper wiring layer formed over the second wiring layer, the upper wiring layer having an upper layer power supply line connected to the first electric power, the upper layer power supply line being electrically connected through second vias to the third power supply line of the second wiring layer, wherein:
the first electric power is different from the second electric power;
in the first wiring layer, a single second power supply line, and no other intervening conductive line, is disposed between said spaced apart first and second ones of said plurality of first power supply lines to which the third power supply line is electrically connected through the first vias,
each of the first, second and third power supply lines is formed such that a longest dimension is in a second direction perpendicular to the first direction,
the number of the second vias that electrically connect the third power supply line and the upper layer power supply line is larger than the number of the first vias that electrically connect the first power supply line and the third power supply line,
the plurality of first power supply lines do not have a concavo-convex shape along their sides, and the third power supply line has a concavo-convex shape along at least one of its sides.

8. The semiconductor device according to claim 7, wherein the adjacent first power supply lines are both connected to convex parts of the third power supply line through the first vias.

9. The semiconductor device according to claim 8, wherein
- a fourth power supply line connected to adjacent second power supply lines through third vias is disposed in the second wiring layer, the fourth power supply line being supplied with the second electric power,
- the fourth power supply lines have a concavo-convex shape along at least one of their sides, and
- the third and fourth power supply lines are arranged so that a convex part of the third power supply line engages with a concave part of the fourth power supply line.

* * * * *